United States Patent [19]

Krenik et al.

[11] Patent Number: 5,274,284
[45] Date of Patent: Dec. 28, 1993

[54] OUTPUT BUFFER CIRCUITS WITH CONTROLLED MILLER EFFECT CAPACITANCE

[75] Inventors: William R. Krenik, Garland; Louis J. Izzi, Plano, both of Tex.

[73] Assignee: Texas Instruments Incorporated, Dallas, Tex.

[21] Appl. No.: 647,614

[22] Filed: Jan. 24, 1991

[51] Int. Cl.⁵ .................. H03K 19/092; H03K 19/20
[52] U.S. Cl. ........................ 307/475; 307/451
[58] Field of Search ............... 307/475, 451, 579, 572, 307/362

[56] References Cited

U.S. PATENT DOCUMENTS

| | | | |
|---|---|---|---|
| 4,725,747 | 2/1988 | Stein et al. | 307/579 |
| 4,771,195 | 9/1988 | Stein | 307/572 |
| 4,797,631 | 1/1989 | Hsu et al. | 330/253 |
| 4,818,897 | 4/1989 | Krenik | 307/362 |
| 4,887,048 | 12/1989 | Krenik et al. | 330/258 |
| 4,963,771 | 10/1990 | Chang | 307/475 |
| 5,015,889 | 5/1991 | Reay | 307/475 |
| 5,034,623 | 7/1991 | McAdams | 307/475 |

Primary Examiner—Edward P. Westin
Assistant Examiner—Richard Roseen
Attorney, Agent, or Firm—Ira S. Matsil; James C. Kesterson; Richard L. Donaldson

[57] ABSTRACT

An integrated circuit buffer includes a source follower output transistor having an output and also connected by a voltage dropping circuit to a supply rail thereby introducing a controlled amount of Miller effect capacitance in the source follower output transistor. The buffer also has a common source output transistor and a unidirectional conducting circuit connecting between the common source output transistor and the source follower output transistor. Other buffers, palette devices, computer graphics systems and methods are also disclosed.

12 Claims, 18 Drawing Sheets

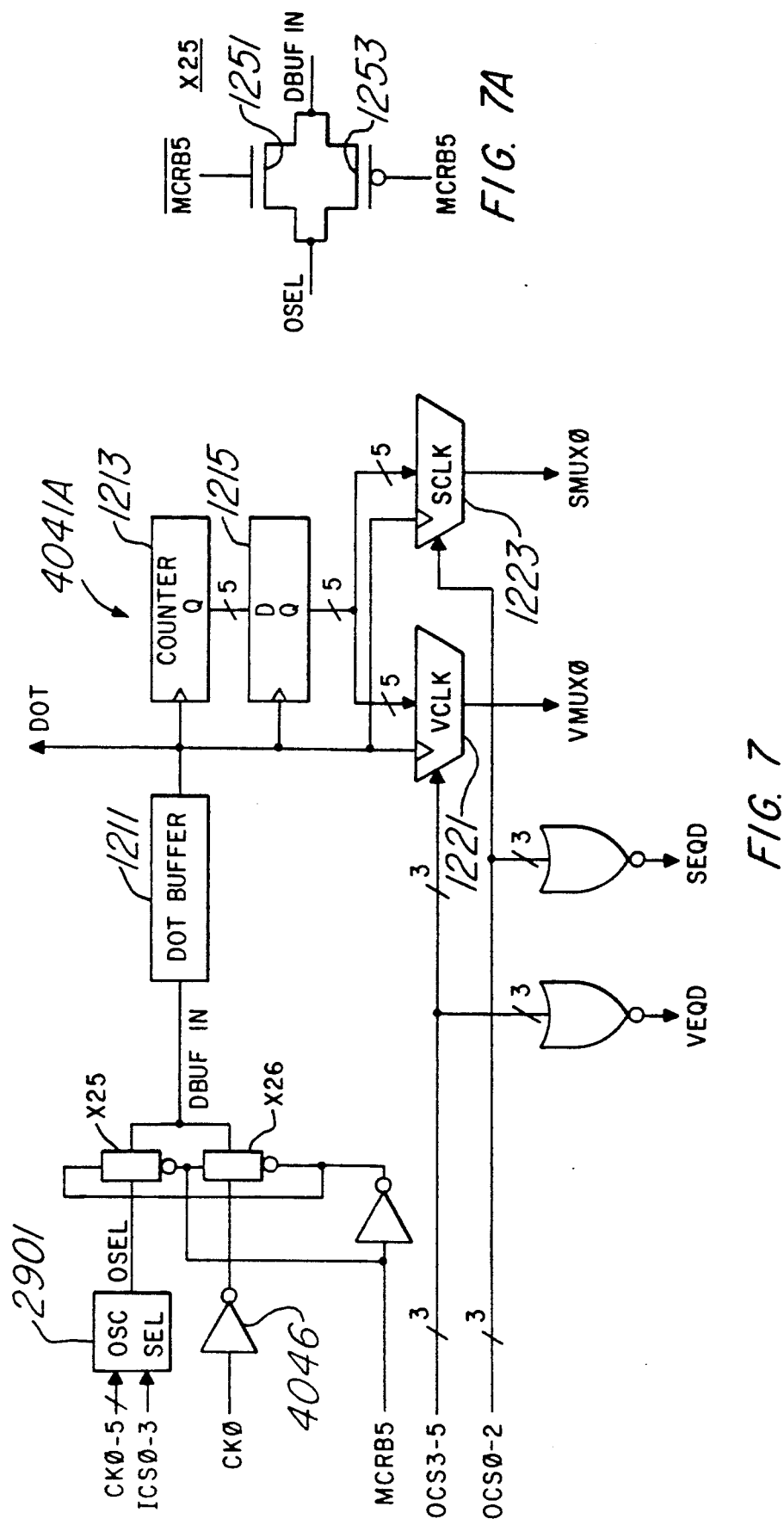

OUTPUT BUFFER CIRCUITS WITH CONTROLLED MILLER EFFECT CAPACITANCE

CROSS-REFERENCE TO RELATED APPLICATIONS

The following coassigned patent applications and patents are hereby incorporated herein by reference as background and supporting information to the subject matter disclosed herein:

Ser. No. 426,480, filed Oct. 23, 1989, "Graphics Data Processor, A Data Processing System, A Graphics Processing System and a Method of Processing Graphics Data";

Ser. No. 387,569, filed Jul. 28, 1989, "Graphics Display Split-Serial Register System";

Ser. No. 544,779, filed Jun. 27, 1990, "Computer Graphics Systems, Palette Device and Methods for Shift Clock Pulse Insertion During Blanking";

Ser. No. 545,424, filed Jun. 27, 1990, "Graphics Systems, Palettes and Methods with Combined Video and Shift Clock Control";

Ser. No. 586,914, filed Sep. 24, 1990, "Multifunctional Access Devices, Systems and Methods";

Ser. No. 502,471 (14676), filed Mar. 30, 1990, "Translator Circuit and Method of Operation";

Ser. No. 590,259, filed Sep. 28, 1990, "Integrated Circuits, Transistors, Data Processing Systems, Printed Wiring Boards, Digital Computers, Smart Power Devices, and Processes of Manufacture";

U.S. Pat. No. 4,771,195 "Integrated Circuit to Reduce Switching Noise";

U.S. Pat. No. 4,797,631 "Folded Cascade Amplifier with Rail-to-Rail Common-Mode Range";

U.S. Pat. No. 4,818,897 "Fast One Way Amplifier Stage";

U.S. Pat. No. 4,887,048 "Differential Amplifier Having Extended Common Mode Input Voltage Range".

BACKGROUND OF THE INVENTION

Without limiting the general scope of the invention, its background is described in connection with computer graphics, as one example only.

In computer systems, a host computer can be programmed to perform general purpose tasks including graphics routines. Greater speed and additional features are often desirable, and so a graphics processor is added to supplement the capabilities of the host computer.

The graphics processor is also called a graphics system processor (GSP), examples of which are the Texas Instruments TMS34010 and TMS34020 GSPs. The addition of a graphics processor makes the computer system a multiprocessor system which can benefit from advances in the art of multiprocessor technology. Furthermore, several different kinds of memory such as ROM, DRAM (dynamic random access memory) and VRAM (video RAM) are useful with computers that have graphics capability, and are desirably accommodated.

In computer graphics systems the low cost of dynamic random access memories (DRAM and VRAM) has made it economical to provide a bit map or pixel map memory for the system. In such a bit map or pixel map memory a color code is stored in a memory location corresponding to each pixel to be displayed. A video system is provided which recalls the color codes for each pixel and generates a raster scan video signal corresponding to the recalled color codes. Thus, the data stored in the memory determines the display by determining the color generated for each pixel (picture element) of the display.

The desirability of a natural looking display and the minimization of memory are conflicting. In order to have a natural looking display it is generally desirable to have a large number of available colors. This implies a large number of bits for each pixel in order to specify the particular color from among a large number of possibilities. However, the provision of a large number of bits per pixel calls for a large amount of memory for storage. Since a number of bits must be provided for each pixel in the display, even a modest sized display would require a large memory. Thus, it is advantageous to provide some method to reduce the amount of memory needed to store the display while retaining the capability of choosing among a large number of colors.

The provision of a circuit called a color palette enables a compromise between these conflicting requirements. The color palette stores color data words that are longer in bit length than color codes that are stored in the pixel map memory instead of the actual color data words themselves. The color data words can specify colors to be displayed in a form that is ready for digital-to-analog conversion directly from the palette. The color codes stored in the memory for each pixel have a limited number of bits, thereby reducing the memory requirements. The color codes are employed to select one of a number of color registers or palette locations. Thus, the color codes do not themselves define colors but instead identify a selected palette location. These color registers or palette locations each store color data words which are longer than the color codes in the pixel map memory. The number of such color registers or palette locations provided in the color palette is equal to the number of selections provided by the color codes. For example a four-bit color code can be used to select 2-to-the-n or sixteen palette locations. The color data words can be redefined in the palette from frame to frame to provide many more colors in an ongoing sequence of frames than are present in any one frame.

Due to the advantages of the color palette devices, systems and methods, any improvements in their implementation are advantageous in computer color graphics technology. Indeed, any improvements in applicable circuits are desirable so that graphics and other computer and electronic systems can be made faster, more reliable and more convenient in commercial application.

SUMMARY OF THE INVENTION

Generally, and in one form of the invention, an integrated circuit buffer includes a source follower output transistor having an output and also connected by a voltage dropping circuit to a supply rail thereby introducing a controlled amount of Miller effect capacitance in the source follower output transistor. The buffer also has a common source output transistor and a unidirectional conducting circuit connecting between the common source output transistor and the source follower output transistor. A technical advantage is that spikes which might occur due to overshoots beyond supply rail voltages are reduced or prevented while controlled switching characteristics are provided. The buffer is applicable in any chip, circuit or system to which its advantages commend it.

Other circuits, palette devices improved with such circuits, computer graphics systems, and methods are described and claimed herein.

BRIEF DESCRIPTION OF THE DRAWINGS

These and other features of the present invention will be readily understood from the following Description, taken in conjunction with the Drawings, in which:

FIG. 7 is a block diagram of part of a clock control circuit of the palette device of FIG. 3;

FIG. 7A is a schematic diagram of a transfer gate in the circuit of FIG. 7;

DETAILED DESCRIPTION OF PREFERRED EMBODIMENTS

Figure 19:
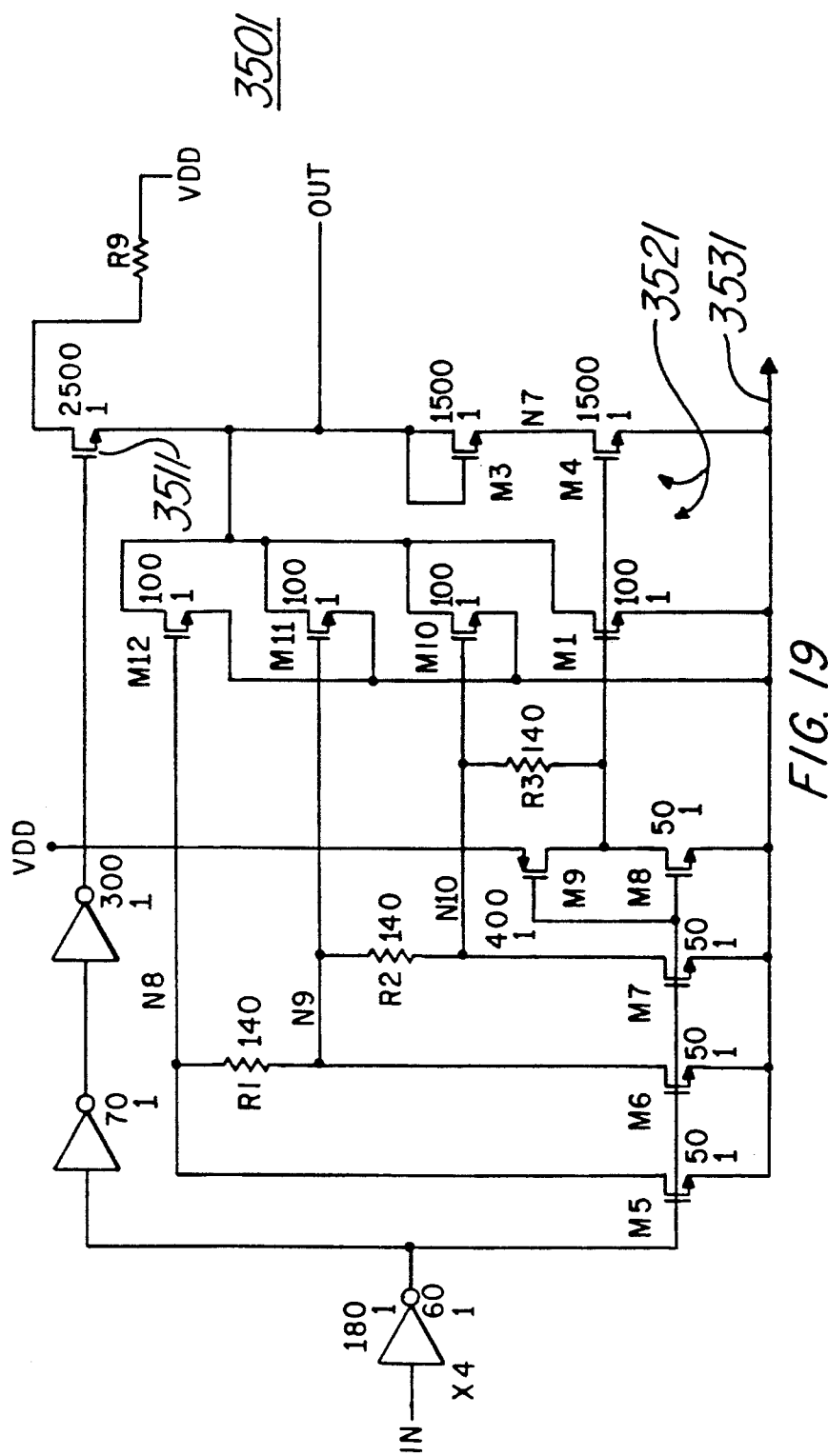
FIG. 19 is a schematic diagram of a buffer circuit that can be used in a shift clock buffer and in a video clock buffer in the circuitry of FIG. 18.
Figure 19A:
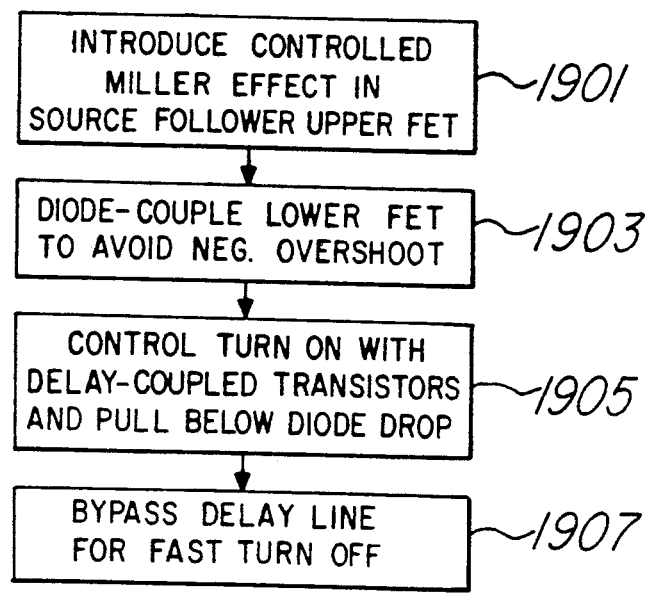
FIG. 19A is a method of making and using the buffer circuit of FIG. 19.

An example of the specific embodiment of the claimed invention is described herein with reference to FIGS. 19 and 19A. Of course, the entire specification and the incorporated references also apply to the presently claimed invention. Accordingly, the claims are not limited to the specific elements described in FIG. 19. The buffer circuit described with reference to FIG. 19 is also useful for other drivers and buffers in all other applications to which its advantages commend it.

Figure 1:
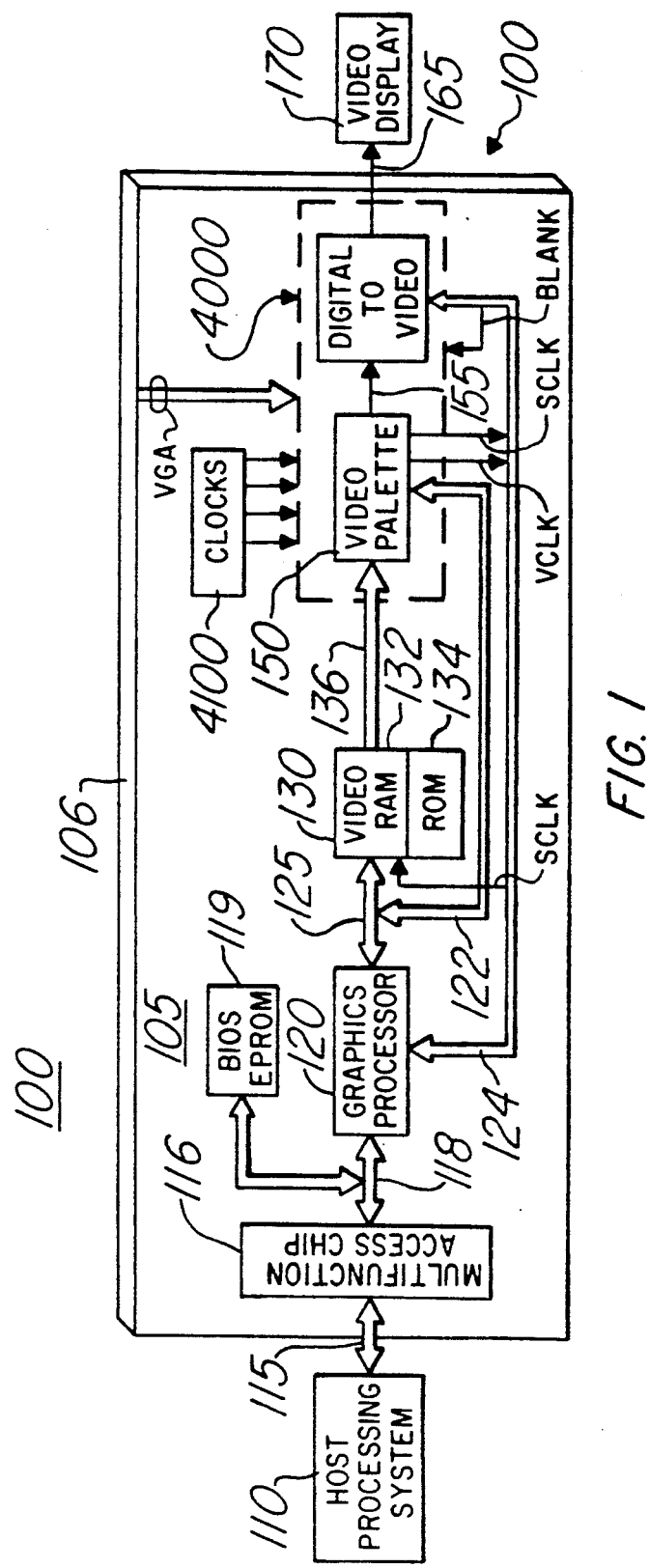
FIG. 1 is a block diagram of a computer graphics system.

FIG. 1 illustrates a computer graphics system 100 including a graphics processing system 105 operating in conjunction with a host system 110. Supporting information is provided in coassigned patent applications Ser. No. 544,774, 545,421, 544,771, 546,172, 544,775, 545,424, 544,779, and 545,422 all cofiled Jun. 27, 1990 and coassigned application Ser. No. 426,480, filed Oct. 23, 1989, each of which is hereby incorporated by reference. Also incorporated by reference herein are publications with further supporting information as follows: Texas Instruments TMS 34010 User's Guide (August 1988); TIGA-340 (TM) Interface, Texas Instruments Graphics Architecture, User's Guide, 1989, TMS 34020 User's Guide (January 1990), and TMS 44C251 Specification, all of which documents are currently available to the general public from Texas Instruments Incorporated.

FIG. 1 illustrates a block diagram of computer graphics system 100 which is constructed in accordance with the principles of a preferred embodiment of the present invention. Graphics processing system 105 includes a graphics printed wiring board 106 connected to a host processing system 110. Located on printed wiring board 106 are a graphics system processor GSP 120, a memory 130, a video palette 150 and a digital to video converter 160. Elements 150 and 160 are connected by bus 155 and combined in a palette device 4000 driven by clock circuitry 4100 all as described in the incorporated patent applications. A video display 170 is driven from the video output of system 105 via connecting cable line 165.

Host processing system 110 provides the major computational capacity for the graphics computer system 100. Host processing system 110 preferably includes at least one microprocessor chip, read only memory, random access memory such as a megabyte or more of DRAM, and assorted peripheral devices such as floppy disk drives, a hard disk drive, a CD-ROM drive and a modem, forming a complete host computer system. Host processing system 110 of FIG. 1 preferably also includes some form of input device, such as a keyboard, a mouse and/or a microphone and provision for multimedia capabilities. An important feature of host processing system 110, as far as the present embodiment is concerned, is that host processing system 110 determines the content of the visual display to be presented to the user by display 170.

Graphics system processor 120 provides the major data manipulation to generate the particular video display presented to the user. Graphics processor 120 is bidirectionally coupled to host processing system 110 via a host bus 115 to a multifunction access chip or circuit 116 and a bus 118 to the GSP 120. GSP 120 operates as an independent data processor from host processing system 110; however, it is expected that graphics processor 120 is responsive to requests from host processing system 110 via access circuit 116 and bus 118. Access circuit 116 is further described in coassigned incorporated application Ser. No. 586,914, filed September 24, 1990, "Multifunctional Access Devices, Systems and Methods"; and further background is provided in coassigned incorporated application Ser. No. 387,569, filed Jul. 28, 1989, "Graphics Display Split-Serial Register System";

Graphics processor 120 further communicates with memory 130, and video palette. 4000 via video memory bus 122 and palette bus 136. Graphics processor 120 controls the data stored within video RAM 132 via video memory bus 125. In addition, graphics processor 120 may be controlled by programs stored in either video RAM 132 or read only memory 134. Read only memory 134 may additionally include various types of graphic image data, such as alphanumeric characters in one or more font styles and frequently used icons. In addition, graphics processor 120 controls the data stored within video palette 150. Also, graphics processor 120 controls digital to video converter 160 via video control bus 124. Graphics processor 120 can, for instance, control the line length and the number of lines per frame of the video image presented to the user by control of digital to video converter 160 via video control bus 124.

When a BIOS ROM or EPROM 119 is provided, the access device 116 is selectively preconfigurable at power-up so that GSP 120 can access the BIOS ROM 119 by asserting addresses in its own local memory space.

Video memory 130 includes video RAM 132 which is bidirectionally coupled to graphics processor 120 via video memory bus 125. Video RAM 130 includes bit mapped graphics data which controls the video image presented to the user. This video data may be manipulated by graphics processor 120 via video memory bus 125. In addition, the video data corresponding to the current display screen is output from video RAM 132 via video output bus, or palette bus, 136. The data from video output bus 136 corresponds to each picture element or pixel to be presented to the user. For one example, video RAM 132 is formed of a plurality of TMS44251 256KX4 dynamic random access memory integrated circuits available from Texas Instruments Incorporated, the assignee of the present application. The TMS44251 integrated circuit includes dual ports, enabling display refresh and display update to occur concurrently.

In accordance with the typical arrangement of video random access memory 132, this memory consists of a bank of several separate random access memory integrated circuits. The output of each of these integrated circuits is typically only one or four bits wide and is output on video output bus 136.

Video palette 150 receives the high speed video data from video random access memory 132 via bus 136. Video palette 150 also receives data from graphics processor 120 via video memory bus 122. Video palette 150 converts the data received on parallel bus 136 into a video digital output via bus 155. This conversion is achieved by means of a look-up table which is specified by graphics processor 120 via video memory bus 122. The output of video palette 150 may comprise color hue and saturation for each picture element or may comprise red, green and blue primary color levels for each pixel or any other suitable technique. The table of conversion from the code stored within video memory 132 and the digital levels output via bus 155 is controlled from graphics processor 120 via video memory bus 122.

Figure 2:
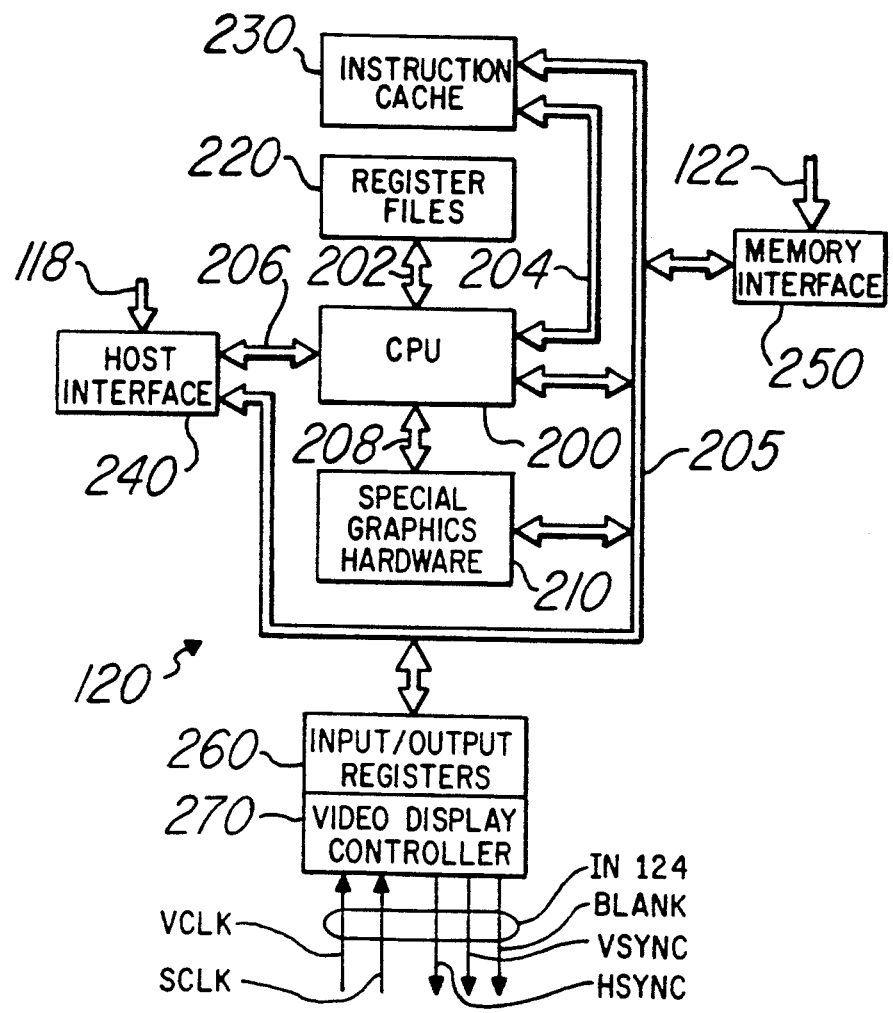
FIG. 2 is a block diagram of a graphics processor.

FIG. 2 illustrates graphics processor 120 in further detail. Graphics processor 120 includes a central processing unit 200, special graphics hardware 210, register files 220, instruction cache 230, host interface 240, memory interface 250, input/output registers 260 and video display controller 270.

Central processing unit 200 not only does general purpose data processing and arithmetic and logic operations but also a number of special purpose graphics instructions, either alone or in conjunction with special graphics hardware 210.

Graphics processor 120 includes a major bus 205 which is connected to most parts of graphics processor 120 including the central processing unit 200. Central processing unit 200 is bidirectionally coupled to a set of register files 220 including a number of data registers, via bidirectional register bus 202. Register files 220 serve as a depository of immediately accessible data used by central processing unit 200. Register files 220 include, in addition to general purpose registers which are employed by central processing unit 200, a number of data registers which are employed to store implied operands for graphics instructions.

Central processing unit 200 is connected to instruction cache 230 via instruction cache bus 204. Instruction cache 230 is further coupled to bus 205 and is loaded with instruction words from video memory 130 (FIG. 1) via video memory bus 122 and memory interface 250. The instruction cache 230 speeds up the execution of functions that are used often within a particular portion of the program executed by central processing unit 200. Access to instruction cache 230 via instruction cache bus 204 is much faster than access to video memory 130.

Host interface 240 is coupled to central processing unit 200 via host interface bus 206. Host interface 240 is further connected to host processing system 110 (FIG. 1) via access bus 118, access circuit 116 and host system bus 115 Host Interface 240 controls the timing of data transfer between host processing system 110 and graphics processor 120. In this regard, host interface 240 enables either host processing system 110 to interrupt graphics processor 120 or vice versa. In addition, host interface 240 is coupled to major bus 205 enabling host processing system 110 via access circuit 116 to control directly the data stored within memory 130. Typically, host interface 240 communicates graphics requests from host processing system 110 to graphics processor 120, enabling the host system to specify the type of display to be generated by video display 170 and causing graphic processor 120 to perform a desired graphic function.

Central processing unit 200 is coupled to special graphics hardware 210 via graphics hardware bus 208. Special graphics hardware 210 is further connected to major bus 205. Special graphics hardware 210 operates in conjunction with central processing unit 200 to perform special graphic processing operations. Central processing unit 200, in addition to its function of providing general purpose data processing, controls the application of the special graphics hardware 210 in order to perform special purpose graphics instructions. These special purpose graphics instructions concern the manipulation of data within the bit mapped portion of video RAM 132. Special graphic hardware 210 operates under the control of central processing unit 200 to enable particular advantageous data manipulations regarding the data within video RAM 132.

Memory interface 250 is coupled to bus 205 and further coupled to video memory bus 122 and 125. Memory interface 250 serves to control the communication of data and instructions between graphics processor 120 and memory 130. Memory 130 includes both the bit mapped data to be displayed via video display 170 and instructions and data necessary for the control of the operation of graphics processor 120. These functions include control of the timing of memory access, and control of data and memory multiplexing. In the preferred embodiment, video memory bus 125 includes multiplexed address and data information. Memory interface 250 enables graphics processor 120 to provide the proper output on video memory bus 125 at the appropriate time for access to memory 130.

Graphics processor 120 further includes input/output registers 260 and video display controller 270. Input/output registers 260 are bidirectionally coupled to bus 205 to enable reading and writing within these registers. Input/output registers 260 are preferably within the ordinary memory space of central processing unit 200. Input/output registers 260 include data which specifies the control parameters of video display controller 270. Video display controller 270 is clocked by a video clock signal VCLK from palette 4000. In accordance with the data stored within input/output registers 260, video display controller 270 generates the signals on video control bus 124 for the desired control of palette 4000. These include horizontal sync (HSYNC), vertical sync (VSYNC) and blanking (BLANK). Data within input/output registers 260 includes data for specifying the number of pixels per horizontal line, the horizontal synchronization and blanking intervals, the number of horizontal lines per frame and the vertical synchronization and blanking intervals. Input/output registers 260 may also include data which specifies the type of frame interlace and specifies other types of video control functions.

Graphics processor 120 operates in two differing address modes to address memory 130. These two address modes are x y addressing and linear addressing. Because the graphics processor 120 operates on both bit mapped graphic data and upon conventional data and instructions, different portions of the memory 130 may be accessed most conveniently via differing addressing modes. Regardless of the particular addressing mode selected, memory interface 250 generates the proper physical address for the appropriate data to be accessed. In linear addressing, the start address of a field is formed of a single multibit linear address. The field size is determined by data within a status register within central processing unit 200. In x y addressing the start address is a pair of x and y coordinate values. The field size is equal to the size of a pixel, that is, the number of bits required to specify the particular data at a particular pixel.

Background information on video RAM (VRAM) is found in coassigned U.S. Pat. Nos. 4,330,852; 4,639,890 and 4,683,555 which are hereby incorporated by reference.

Figure 3:
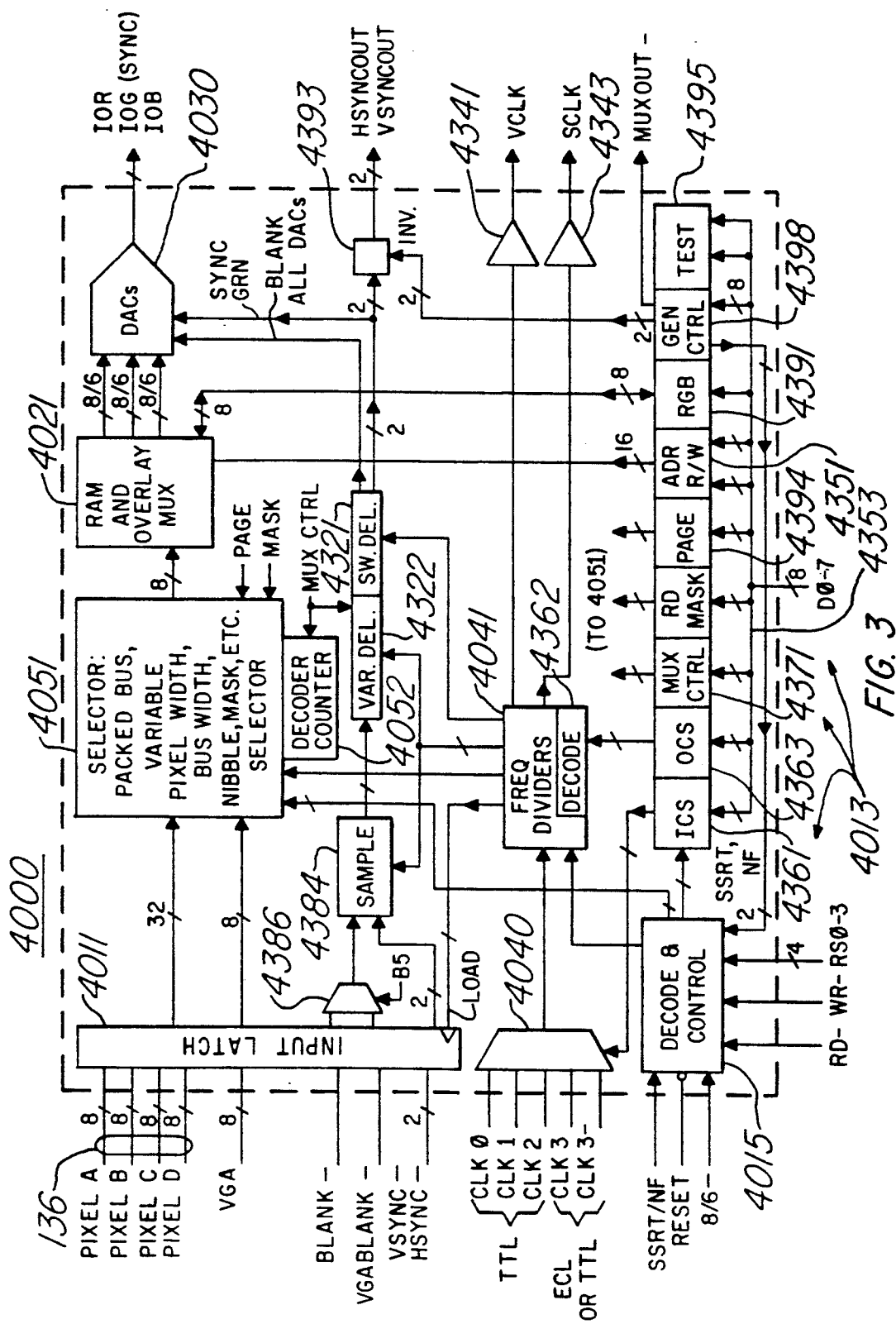
FIG. 3 is a block diagram of a single-chip palette device.

In FIG. 3, palette 4000 has numbering to correspond with that of FIG. 31 of coassigned incorporated application Ser. No. 544,779. Palette 4000 has an input register 4011 with a first area connected to the video memory 130 of FIG. 1 to enter a first set of color code bits. Input register 4011 has a second area connected to a VGA feature connector to enter a second set of color code bits according to the VGA standard. Look-up table memory 4021 supplies color data words in response to color codes from the input register 4011. Selector circuit 4051 is connected between the input register 4011 and the look-up table memory 4021. The selector circuit 4051 is connected via a control register 4371 to graphics processor 120 via bus 122 of FIG. 1 herein and is thereby controllable to transfer selected color codes to look-up table memory 4021. The color codes come from bus 136 or from the VGA bus depending on which is selected.

Further parts, operations and features of palette 4000 are described in connection with FIG. 31 of the incorporated patent applications pertaining to it and cited above. Some of the most pertinent parts and improvements are discussed hereinbelow.

Figure 4:
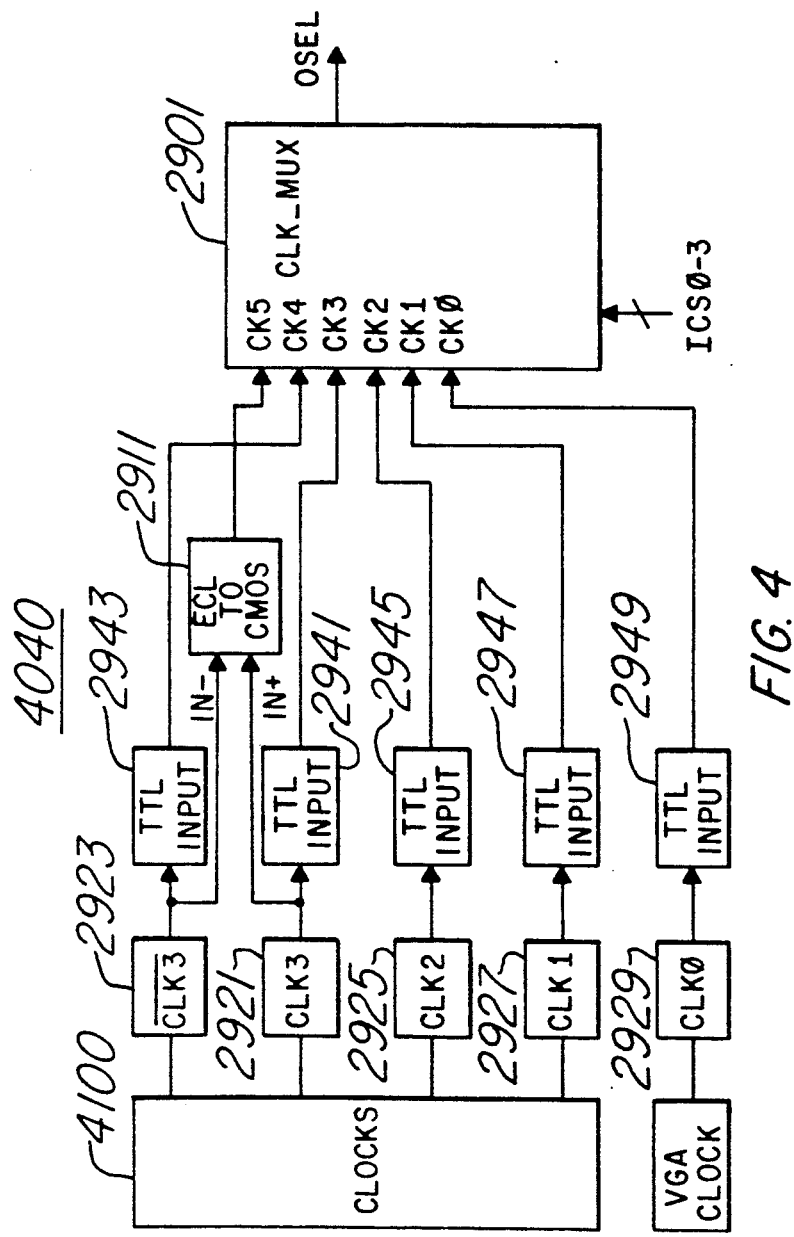
FIG. 4 is a block diagram of a clock input section of the palette device of FIG. 3.
Figure 18:
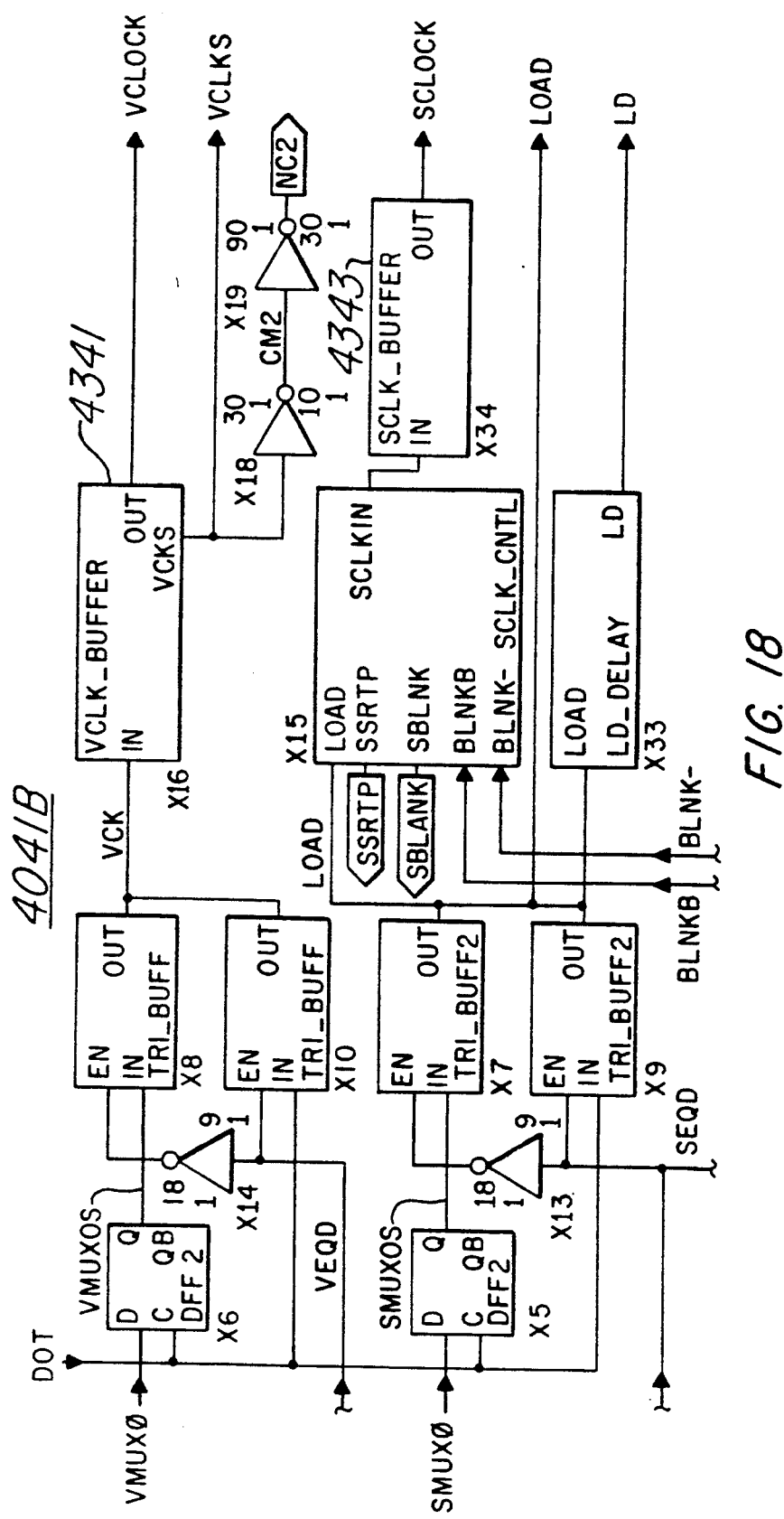
FIG. 18 is a block diagram of further clock control circuitry connected to the circuitry of FIG. 7 in the palette device of FIG. 3.

A clock control section 4040,4041 of FIG. 3 is shown in greater detail in FIGS. 4, 7, and 18 herein. These figures are discussed in general terms before proceeding to detailed descriptions of each.

In FIGS. 3,4,7 and 18, clock generation circuitry generates selected dot clock DOT, video clock VCLK and shift clock SCLK frequencies based on control signals MCRB5 (mux control register 4371 bit 5),input clock select ICS 4361 bits 0-3, and five oscillator inputs CLK0, CLK1, CLK2, CLK3, CLK3 —. Block 4040 has circuitry for selecting which of the clock oscillators in block 4100 of FIGS. 1 and 4 are allowed to drive the programmable palette 4000. The output of block 4040 in FIG. 3 feeds block 4041 which is a clock divider to determine the correct frequency for SCLK and VCLK based on output clock select register 4363 bits OCS0-5. In this way, different display 170 resolutions and graphics architectures are accommodated.

The SCLK divide ratio in circuit 4041 is equal to the pixel bus width divided by the pixel depth, and divides the dot clock selected by block 4040. If there is a 32 bit wide data path and a 4 bit pixel, the divide ratio is 8. This is pertinent because it confers the capability of using all of the pixels in the input latch 4011 before loading the next set of 8 pixels into input latch 4011. The divide ratio (e.g. divide-by-8 of dot clock) yields the frequency of shift clock SCLK which causes 8 pixels to be loaded on each rising edge. In this example, the palette 4000 is sequentially accessing register 4011 to move four-bit portions one after the other to address RAM 4021 eight times (at dot clock rate) before the next SCLK cycle is generated by this division circuitry to parallel-load input latch 4011 from bus 136 with a new set of 32 bits constituting 8 pixels of 4 bits each.

In FIG. 4, the clock input block 4040 of palette 4000 has a clock multiplexer 2901 fed at an input CK5 by an ECL-to-CMOS buffer 2911. A pair of clock input bond pads 2921 and 2923 (CLK3 and CLK3—) are connected to positive and negative inputs IN+ and IN— of buffer 2911. Clock input bond pads 2921, 2923, 2925, 2927 and 2929 are also respectively connected to a set of TTL input circuits 2941, 2943, 2945, 2947 and 2949. The outputs of the TTL input circuits are respectively connected to inputs CK3, CK4, CK2, CK1 and CK0. In this way clock multiplexer circuit 2901 has five inputs from TTL-to-CMOS input circuits 2941-2949 and a sixth input CK5 from ECL-to-CMOS buffer 2911.

Advantageously, all the multiplexing logic is self-contained in multiplexer 2901 so that all the clocks arrive at the multiplexer 2901 as a common starting point for clocking beginning from circuit 2901 and thereafter throughout subsequent circuitry. The TTL input circuits 2941-2949 are suitably placed near the bond pads. The modularity and portability of the circuit design blocks is advantageous in flexibly providing circuits for alternative embodiments.

Figure 5:
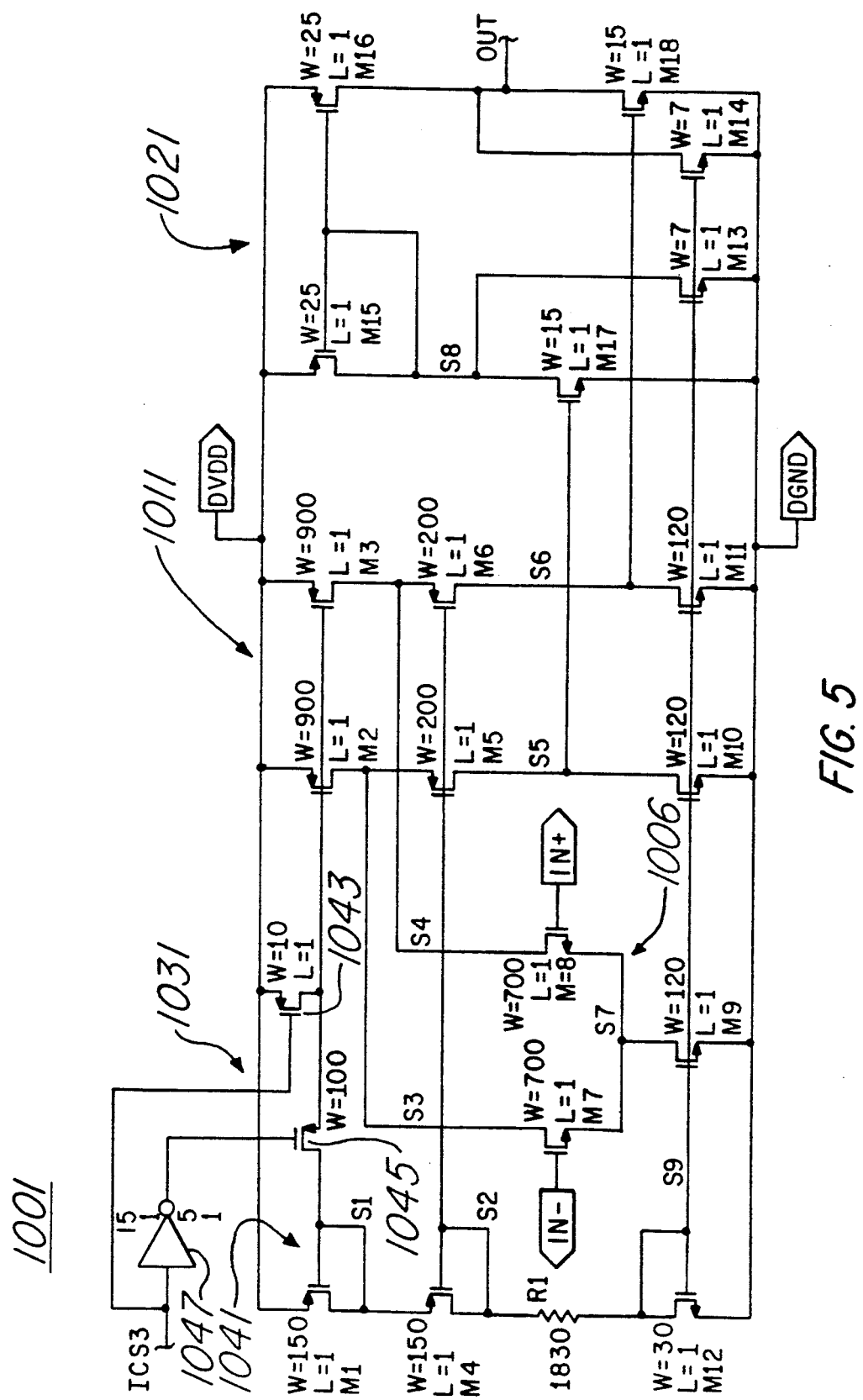
FIG. 5 is a schematic diagram of an ECL-to-CMOS buffer in FIG. 4.

FIG. 5 shows a high speed ECL (emitter coupled logic) to CMOS (complementary metal oxide semiconductor) input buffer 1001 of a preferred embodiment, shown to implement circuit 2911 in FIG. 4. Some background to this special circuit technology is discussed in coassigned incorporated U.S. Pat. No. 4,797,631 "Folded Cascade Amplifier with Rail-to-Rail Common-Mode Range", U.S. Pat. No. 4,818,897 "Fast One Way Amplifier Stage", and U.S. Pat. No. 4,887,048 "Differential Amplifier Having Extended Common-Mode Input Voltage Range". Also see coassigned patent application Ser. No. 502,471, filed Mar. 30, 1990, "Translator Circuit and Method of Operation" which is hereby incorporated herein by reference.

In the preferred embodiment of FIG. 5, input buffer 1001 has a differential input circuit 1006 feeding a folded cascade amplifier 1011 followed by a common-source differential amplifer 1021 with push-pull output OUT. Common mode control is advantageously achieved without having any feedback circuit in the folded cascade amplifier 1011. Class A biasing provided by a pair of transistors M13 and M14 augments the common source amplifier 1021 to speed recovery times. A power down circuit 1031 is also provided. Advantageously, the input buffer 1001 in a preferred embodiment can achieve over 150MHz. ECL input level performance in one (1) micron CMOS.

ECL inputs IN+ and IN− are respectively connected to the gates of differentially connected n-channel FETs M7 and M8. Width and length dimensions in micrometers are marked on FIG. 5 for all of the transistors. An n-channel current source transistor M9 has its source connected to DGND ground reference and its drain connected to the sources of n-channel FETs M7 and M8. The gate of current source transistor M9 is connected with the gates of other n-channel FETs M10, M11, M13 and M14 to an n-channel bias transistor M12.

Transistor M12 is part of a biasing network 1041 connected between supply voltage DVDD and reference DGND. Network 1041 has as serially connected components p-channel FETs M1 and M4, a resistor R1, and n-channel FET M12. The source of FET M1 is connected to DVDD. The source of FET M4 is connected to both the drain and gate of FET M1. Resistor R1 is connected at one end to both the drain and gate of FET M4. Resistor R is connected at its other end to both the drain and gate of FET M12. The sources of FETs M12, M9, M10, M11, M13 and M14 are all connected to DGND ground reference.

Bias network 1041 provides a ratiometric divide-down of the power supply from DVDD to DGND and establishes bias currents in transistors M9, M13, M14, and M10 and M11 respectively for the differential amplifiers 1006 and 1021 as well as the folded cascade amplifier 1011. The diode connection of FETS M1, M4 and M12 forces each of the devices to be on and thus constitute nonlinear devices with the same current flowing through them to generate voltage drops respective to each of them. The voltage drops through FETs M1 and M4 are substantially the same because they are p-channels of the same geometric configuration. The voltage drop across FET M12 is different because it is n-channel with different geometry.

Biasing considerations in the rest of the circuitry are now discussed. A common mode level of lines S5 and S6 should not be too high into the gates of transistors M17 and M18 since they would then draw too much current and waste power. The common mode level of lines S5 and S6 should not be too low because that might shut off transistors M17 and M18. The common mode level of lines S5 and S6 is controlled by the bias network 1041, and the resistance R1 cooperates with the rest of the bias network to set the common mode level of S5 and S6 so that the common mode level is responsive to the network 1041 but the operation of network 1041, and amplifier 1006 as well, is independent of and free of any feedback from the common mode level.

Resistance R1 advantageously controls the common mode level of lines S5 and S6 to be neither too high or low for transistors M17 and M18 and further to stay between a first high level at which cascode transistors M5 and M6 enter triode operation and a second low level at which transistors M10 and M11 enter triode operation. In the advantageously uncomplicated network 1041 of the embodiment of FIG. 5, the resistance R1 provides a 0.2 volt voltage drop instead of using an on-transistor which would have a a much higher 0.7-1.0 volt voltage drop. In this way bias levels in this embodiment are conveniently obtained at amounts that strike a good balance between the too-high and too-low common mode levels discussed above.

Advantageously, extra common mode feedback circuitry from points S5 and S6 to the bias network 1041 is avoided and rendered unnecessary. Also avoided is an extra speed-limiting load, or parasitic capacitance, which such feedback circuitry could present to lines S5 and S6.

Differential amplifier 1006 and folded cascade amplifier 1011 together act as a comparator, i.e. a circuit wherein the output need not be linearly related to the differential input. This circuit 1001 thus recognizes not only that the parasitic capacitance of feedback circuitry which might have been used on S5 and S6 can be eliminated, but also that linearity and harmonic distortion are not an issue. The selection of the biasing from network 1041 is such that lines S5 and S6 are made incapable of drifting out of the common input range of the second stage amplifier M17 and M18. Remarkably, the simplicity of the bias arrangement and overall circuit configuration makes this operation unobtrusive but effective.

Since there can be some variation in common mode input, the amplifier 1021 is constructed to have an advantageous tolerance for it. This tolerance is conferred by judicious selection of the sizes of the transistors M17 and M18 relative to transistors M15 and M16. This can be especially useful at very high video frequencies in which input capacitance can load down input signal levels. Various criteria are considered. First is a dimensional ratio RR of ratios equal to W-divided-by-L of the current mirror transistors (e.g. M15 and M16) to W/L of the bottom transistors (e.g. M17 and M18). Second is a ratio MR of mobilities of p-channel (M15, M16) transistors to n-channel (M17,M18) transistors in the technology employed. In this embodiment the p-channel mobility is about a third (1:3) of the n-channel mobility. These criteria are important because the bias current, mobility and W/L ratio establish the transconductance of the FETs. However, the transconductance is a small signal concept and is difficult to define over large signal ranges, so the present discussion uses the just-mentioned other physical ratios and properties.

In one example of circuit 1001 of FIG. 5, the ratio RR of ratios W/L was in a range between 1 and 3 and was preferably 1.67 (25/1:15/1). If the mobility ratio MR were 1:2, the p-MOS devices M15 and M16 would be made smaller so that the ratio RR of ratios would be smaller, such as 1.3, for example.

An empirical formula is RR×MR=constant K, where K lies in a range between 0.3 and 1 and is preferably about 0.6. A voltage division concept lies behind the empirical formula, since W/L is analogous to resistance and mobility is analogous to current. Then the product of ratios RR×MR is analogous to a ratio of voltages across the top and bottom transistors in circuit 1021. (It is emphasized that analogy is not identity in this heuristic discussion.) If the voltage desired at point S8 is a fraction F (e.g. 0.66) of the supply DVDD, then the ratio K of the voltage across the upper transistor M15 to the voltage across M17 is K=(1/F)−1 (e.g. 0.5).

Folded cascode amplifier 1011 has two legs connected between DVDD and DGND. A left leg has serially connected transistors—p-channel FET M2, p-channel FET M5 and n-channel FET M10. A right leg corresponding has serially connected transistors—p-channel FET M3, p-channel FET M6, and n-channel FET M11. The sources of FETS M2 and M3 are connected to DVDD. The sources of FETs M5 and M6 are respectively connected to the drains of FETs M2 and M3 and to the drains of differential input FETs M7 and M8 in circuit 1006. The gates of FETS M5 and M6 are connected together and to the gate and drain of biasing transistor M4. The drains of FETs M10 and M11 are respectively connected to the drains of FETs M5 and M6 and further to the gates of n-channel FETs M17 and M18 in the common source differential amplifier 1021.

Cascode transistor M5 and cascode transistor M6 are biased by transistor M4 to each have a bias current at all times. The bias in FET M9 is established less than the bias current in FETs M2 and M3. This keeps M2 and M3 conducting at all times regardless of the logic state of the inputs IN+ and IN−. As a result the folded cascode amplifier 1011 has a reduced recovery time and increases the speed capabilities of the buffer 1001 itself. This circuit also provides an improved folded cascode comparator in various embodiments.

FETs M2 and M3 are current source transistors that are not in the AC signal path. FETs M5 and M6 are common gate amplifiers that have their sources and drains in the AC signal path from differential amplifier 1006, and with their gates connected to constant-bias point S2. FETs M10 and M11 are bias transistors that play a similar role to M2 and M3 in that they are current sources that have their drains varying in voltage with the AC signal provided by the drains of transistors M5 and M6 respectively.

FETs M5 and M6 provide advantageous isolation of points S5 and S6 from variations in common mode input voltage at points S3 and S4. FETs M5 and M6 provide another amplification stage that confers high gain and provides a level shift as set by the bias network 1041 and not by the input common mode level.

Thus, if common mode level (i.e., the average of levels at points S3 and S4) were to vary, then a disadvantageously varying common mode level might be passed to the gates of transistors M17 and M18. The circuit common mode level at points S3 and S4 is about 3 volts. This is far from a 2 volt common mode voltage level for the transistors M17 and M18. By adding transistors M5 and M6, the AC impedance presented to points S3 and S4 is made much lower than it would be without them. Also, isolation between the input common mode signal level and the output signal swing is provided because S3 and S4 have been made low impedance nodes by virtue of adding M5 and M6. The drain of M5 is low impedance. Point S7 is a virtual ground or reference potential. In this way Miller effect between gate and drain of transistors M7 and M8 is greatly attenuated or eliminated.

FETs M15 and M16 are p-channel transistors with sources connected to DVDD and with gates connected together and with the gate of M15 connected to its drain to form a current mirror circuit. The common source differential output circuit having FETs M17 and M18 is supplied by the current mirror transistors M15 and M16. FETs M17 and M18 have their drains respectively connected to the drains of FETs M15 and M16 and to the drains of FETs M13 and M14. The drain of FET M18 is connected to an output line OUT from the buffer 1001. The sources of FETs M17, M18, M13 and M14 are all connected to reference DGND.

In another advantageous feature, transistors M13 and M14 are biased from transistor M12 to keep current mirror transistors M15 and M16 active at all times. In this way the switching speed of the differential output circuit 1021 is increased.

The output can be a rail-to-rail signal. FET M17 and the current mirror provide upper drive via FET M16 in a pushpull output arrangement with lower transistor M18. FET M18 sinks current and FET M17 sinks current alternately. FET M17 thereby causes the current mirror of FETs M15 and M16 to make FET M16 source current from DVDD into the output OUT when FET M18 is off. The push-pull arrangement provides better power efficiency. Since the circuit 1001 is fully differential the circuit rejects power supply noise such as the dot clock ripple minimized in FIG. 10. In this way, a 0.5 volt ECL clock input at input lines IN+ and IN− is amplified to a 2 volt peak to peak signal or even a rail to rail signal that can be fed to a CMOS inverter.

Power-down circuit 1031 has a p-channel FET 1043 with its source connected to DVDD and its drain connected to the source of a p-channel FET 1045 that has its drain connected to the gate and drain of FET M1. The gate of FET 1043 is fed from an input control line ICS3, and the gate of FET 1045 is complementary-fed by an inverter 1047 having its input also connected to line ICS3. Thus, when ICS3 is in a first state (e.g. low), FET 1043 turns on and FET 1045 turns off, thereby disabling folded cascode amplifier 1011 and reducing power drain in circuit 1001 when it is to be inactive. When ICS3 is in a complementary state (e.g. high), FET 1043 is off and FET 1045 is on, connecting bias from transistor M1 to the gates of folded cascode amplifier transistors M2 and M3, activating them. Bias network 1041 with M1, M4, R1 and M12 remains conducting even when FETs M2 and M3 are turned off by network 1031. In this way points S5 and S6 are forced low and FETs M17 and M18 in circuit 1021 are made to turn off. Nodes S5 and S6 are always prevented from floating in this embodiment.

Figure 5A:
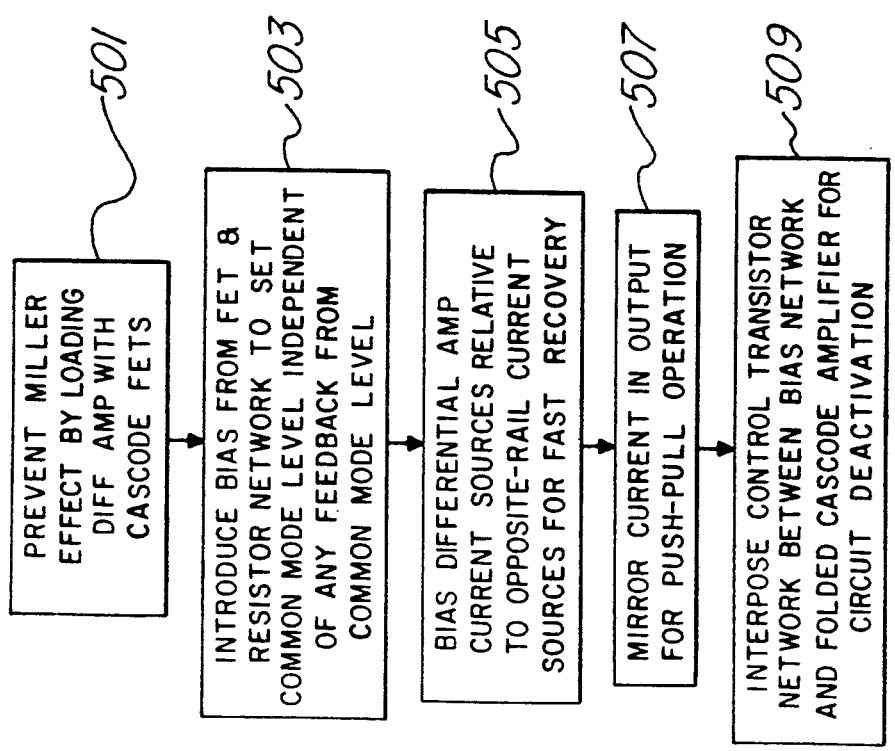
FIG. 5A is a flow diagram of a method of operating the buffer of FIG. 5.

In FIG. 5A a method of operating a buffer has a step 501 of preventing Miller effect by loading a differential amplifier with cascode field effect transistors. A step 503 introduces bias voltages from a network having transistors and a resistance to set a common mode level for the cascode transistors wherein the bias voltages are generated independently of any feedback from the common mode level. The bias voltages establish a respective lesser current from a current source in an input differential amplifier and a greater current from current sources connected to the cascode transistors. A further step 505 biases output differential amplifier current sources relative to opposite-rail current sources for fast recovery time and thus high speed. A step 507 mirrors the current in the output stage for push-pull operation. Another step 509 interposes a control transistor network between the bias network and the folded cascode amplifier for circuit deactivation and low power consumption as appropriate.

Figure 6:
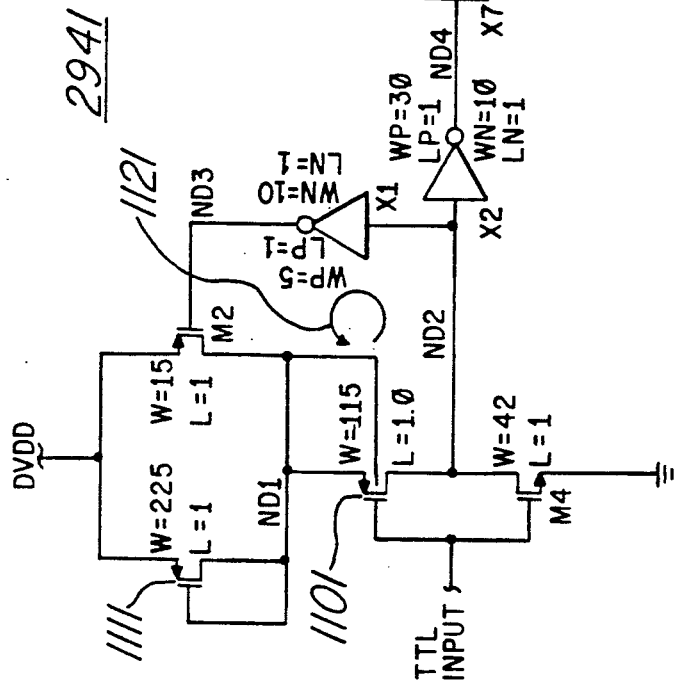
FIG. 6 is a schematic diagram of a TTL-to-CMOS buffer in FIG. 4.

In FIG. 6, a representative circuit 2941 of the identical TTL input circuits 2941-2949 of FIG. 4 acts as an inverting TTL to CMOS buffer. A TTL input is connected to the respective gates of a p type field effect transistor 1101 and an n-channel transistor M4 which together act as a first inverter. These transistors 1101 and M4 change state or switch at a TTL input threshold level of 1.4 volts. Since these CMOS (complementary metal oxide semiconductor) transistors 1101 and M4 would have a much higher threshold voltage if transistor 1101 were connected to power supply rail DVDD (5 volts), the voltage supplied to transistor 1101 is lowered artificially by the diode-connected p-channel 1111.

When the TTL input is greater than 1.4 volts the n-channel transistor M4 pulls node ND2 to ground quickly in a negative transition because M4 is relatively large for an n-channel MOSFET. Without more, the p-MOS transistor 1101 would cause a slower positive transition on node ND2 when the latter transition is called for. Advantageously, an inverter X1 speeds up the positive transition as node ND2 rises. When node ND2 rises inverter X1 makes the voltage fall at the gate of a p-channel transistor M2. The source of M2 is connected to DVDD and its drain is connected to the source of transistor 1101 as well as the gate and drain of diode connected p-channel 1111. The fall in voltage at the gate of M2 turns it on, thus turning on transistor 1101 more quickly and causing node ND2 to slew positive more quickly.

The n MOS transistor (width WN=10) in the inverter x1 is larger than the p MOS (width WP=5). As a result, the inverter X1 has a trip threshold very close to common (the supply rail opposite DVDD). Advantageously, the inverter X1 slews fast almost as soon as node ND2 starts to rise, thus speeding up a positive feedback loop 1121 comprising transistors 1101, M2 and inverter X1.

Three inverters X2, X7 and X8 of successively increasing size buffer the output of node ND2 in order to conveniently drive a CMOS load.

In FIG. 7, oscillator selection circuit 2901 supplies a selected clock oscillator signal on line OSEL to MOS transfer gates X25 and X26. The transfer gates are controlled by a line MCRB5 from mux control register (4371 of FIG. 3) bit 5 which defines whether the VGA pass through mode is activated or not. In FIG. 4 the VGA clock is connected to clock pin CLK0 and buffer 2949 passes it to input CK0. In the VGA pass through mode, the VGA clock at input CK0 is passed through inverter 4046 and gate X26 to DOT BUFFER 1211. Otherwise, a selected clock on the graphics board 106 on line OSEL is passed through gate X25 to DOT BUFFER 1211. In this way palette 4000 moves video data under control of VGA clock or any particular selected video clock from clocks 4100. Frequency division from the dot clock DOT is provided by a counter 1213 and a latch 1213. Five lines from the output of latch 1215 carry pulses that are divided by various powers of two from the dot clock. VCLK mux 1221 and SCLK mux 1223 select particular selected ones of the five lines (or DOT clock itself) in response to the output clock select lines OCS3-5 for mux 1221 and OCS0-2 for mux 1223. The selected clock lines supply outputs VMUX0 and SMUX0 to circuitry as later described in connection with FIG. 18.

NOR gates VEQD and SEQD of FIG. 7 are respectively connected to lines OCS3-5 and OCS0-2 to supply outputs which respectively represent whether video clock VCLK (and shift clock SCLK) is equal in frequency to dot clock or not.

The pass gates X25 and X26 of FIG. 7 introduce negligible delays and effectively provide a switch between VGA clock and other clock oscillators. The gates are identical and gate X25 is described in FIG. 7A. Gate X25 has an n-channel FET 1251 that is 10 microns wide and 1 micron long, as well as a p-channel FET 1253 that is 30 microns by 1 micron. The sources and drains of FETS 1251 and 1253 are respectively connected together and the gates are separately accessible. OSEL is connected to the drains and the sources are connected to line DBUFIN. In FIG. 7 the bubble on each gate X25 and X26 connects to the p-MOS gate and the opposite input goes to the gate of the n-mos gate. To turn the pass gate X26 on, positive voltage is fed to the n-mos gate and logic zero ground voltage to the p-mos gate in response to VGA pass-through mode bit MCRB5. Input connections are reversed to gate X25, turning it off when MCRB5 is active.

Figure 8A:
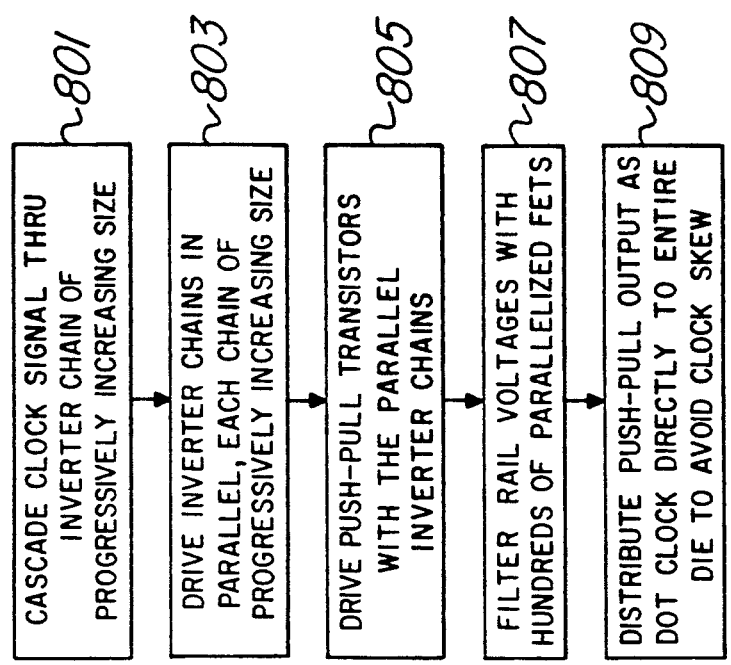
FIG. 8A is a flow diagram of a method of making and operating the buffer of FIG. 8.
Figure 8:
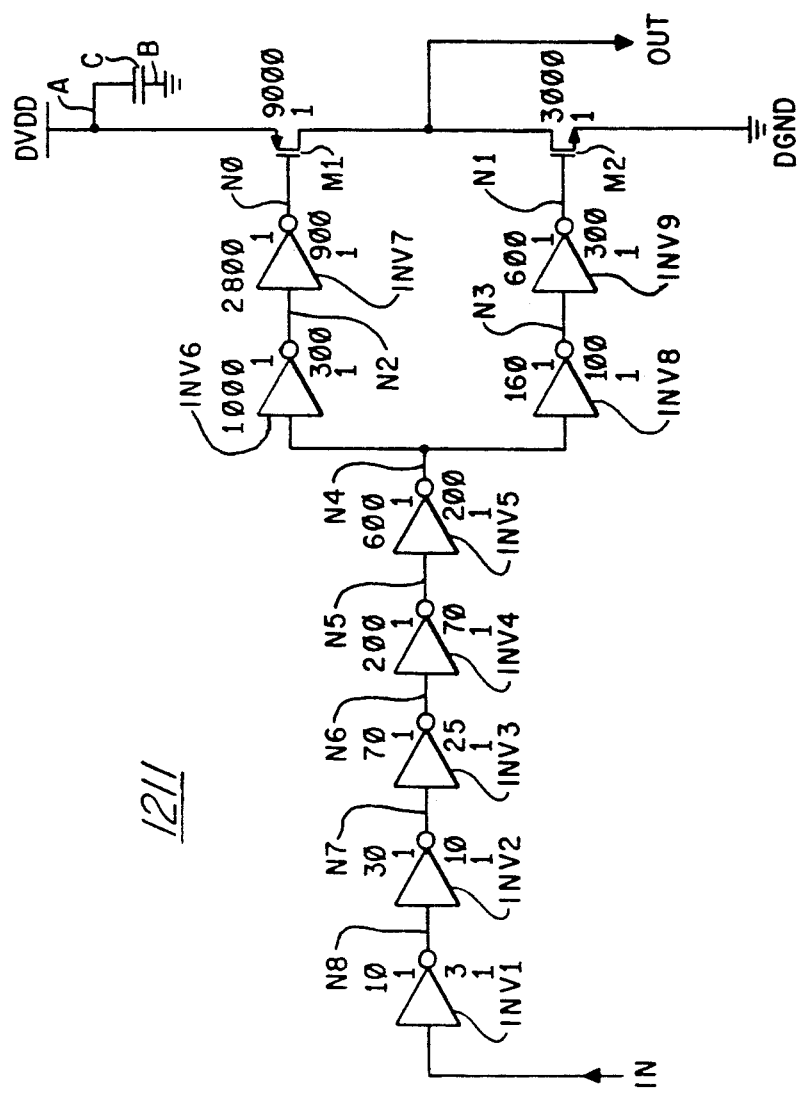
FIG. 8 is a schematic diagram of a dot clock buffer circuit in the circuit of FIG. 7.

Dot-clock buffer 1211 of FIG. 8 suitably implements the block DOT BUFFER of FIG. 7. The dimensions of a pair of complementary output transistors M1 and M2 and their input drive inverters INV7 and INV9 are made large for very substantial drive capability. Advantageously buffer 1211 supplies a master DOT clock from its one central location to circuits throughout the entire integrated circuit die of palette 4000, thereby minimizing dot clock skew throughout the die.

Predrive inverters INV1-INV5 provide successive stages of predrive amplification to successive nodes N8-N4 so that the successively larger devices can be easily driven at full swing between high and low logic levels at video frequencies. The signal at node N4 simultaneously feeds inputs of two inverter chains INV6, INV7 and INV8, INV9 which respectively drive the gates of output transistors M1 and M2.

Integrated circuit packaging introduces resistances and inductances associated with lead frame etches and bond wires. Although the resistances and inductances are small, they are preferably taken into account at video frequencies up to and beyond about 140 MHz. When the resistances and inductances are modeled along with on-chip parasitic capacitances between Vcc and ground reference, a significant voltage drop across the power supply leads might cause a ripple on the order of hundreds of millivolts.

Introducing an on-chip low resistance decoupling capacitor C across supply rails DVDD and DGND greatly reduces the ripple. A special layout achieves very low resistance by placing many gated capacitors in parallel thereby reducing the resistance.

The clock buffer circuit of FIG. 8 is suited for driving at output OUT an on-chip capacitance of 75 picofarads (pf) at video frequencies such as 135 MHz. The power supply leads DVDD and DGND respectively connected to the complementary output transistors M1 and M2 do not have zero resistance and zero inductance, as they would ideally. When the chip is packaged, the leads and wires to the bond pads contribute to both inductance and resistance. With one package, the inductance can be on the order of 15 nanoHenries (nH) and the resistance can be on the order of 0.5 ohms. The effect of the inductance becomes significant at video frequencies and in view of the current desired to drive the on-chip capacitance. The voltage drop across the lead is expressed as $$V = IR + L\, di/dt.$$

Roughly speaking, the impedance contribution of the inductance is 15 nH times 2 pi times 135 MHz, or about 13 ohms.

In FIG. 8A a method of operating the buffer of FIG. 8 begins with a step 801 of cascading a signal through a first inverter chain of progressively increasing size. Then a step 803 drives additional inverter chains each of progressively increasing size, in parallel from the first inverter chain. A further step 805 drives push-pull transistors between supply rails with the additional inverter chains. Then a step 807 filters the supply voltages of the supply rails with a plurality such as tens, hundreds, thousands or even more parallel connected integrated circuit structures such as field effect transistors, operative as an integrated circuit capacitor. A further step 809 distributes the push-pull output of the buffer as a dot clock directly to an entire die such as a palette to avoid clock skew. FIG. 8 shows a dot clock buffer provided and operated according to the method of FIG. 8A.

Figure 9:
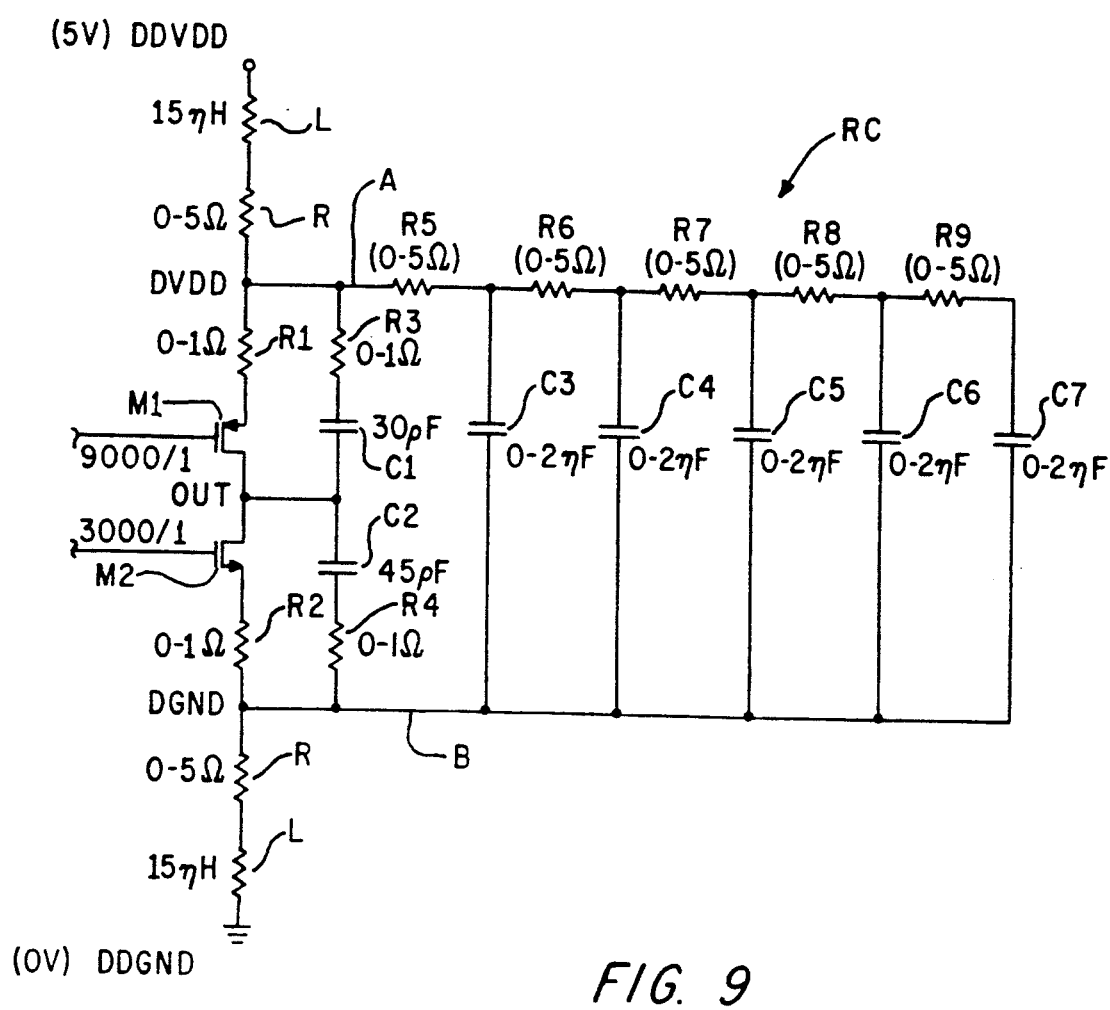
FIG. 9 is a schematic diagram representing an electrical model of an output circuit of the buffer circuit of FIG. 8.

FIG. 9 models the lead inductances L and resistances R. Resistances R1 are smaller on-chip resistances. On-chip parasitic capacitances C1 and C2 are 30 pf and 45 pf respectively. When an on-chip capacitor is provided across DVDD and DGND, the result is actually a distributed resistance/capacitance network RC. Network RC is connected between DVDD and DGND, and has a series of distributed resistances R5-R9 and distributed shunt capacitances C3-C7. Providing high capacitance and low resistance in network RC is advantageously accomplished by embodiments described herein.

Ripple on DVDD and DGND is very substantial if the distributed resistances R5-R9 were all 500 ohms. Substantial but reduced ripple occurs when resistances R5-R9 are all 5 ohms. Output clock edges are well defined although the ripple voltage variation on the power supply leads is still high.

Figure 10:
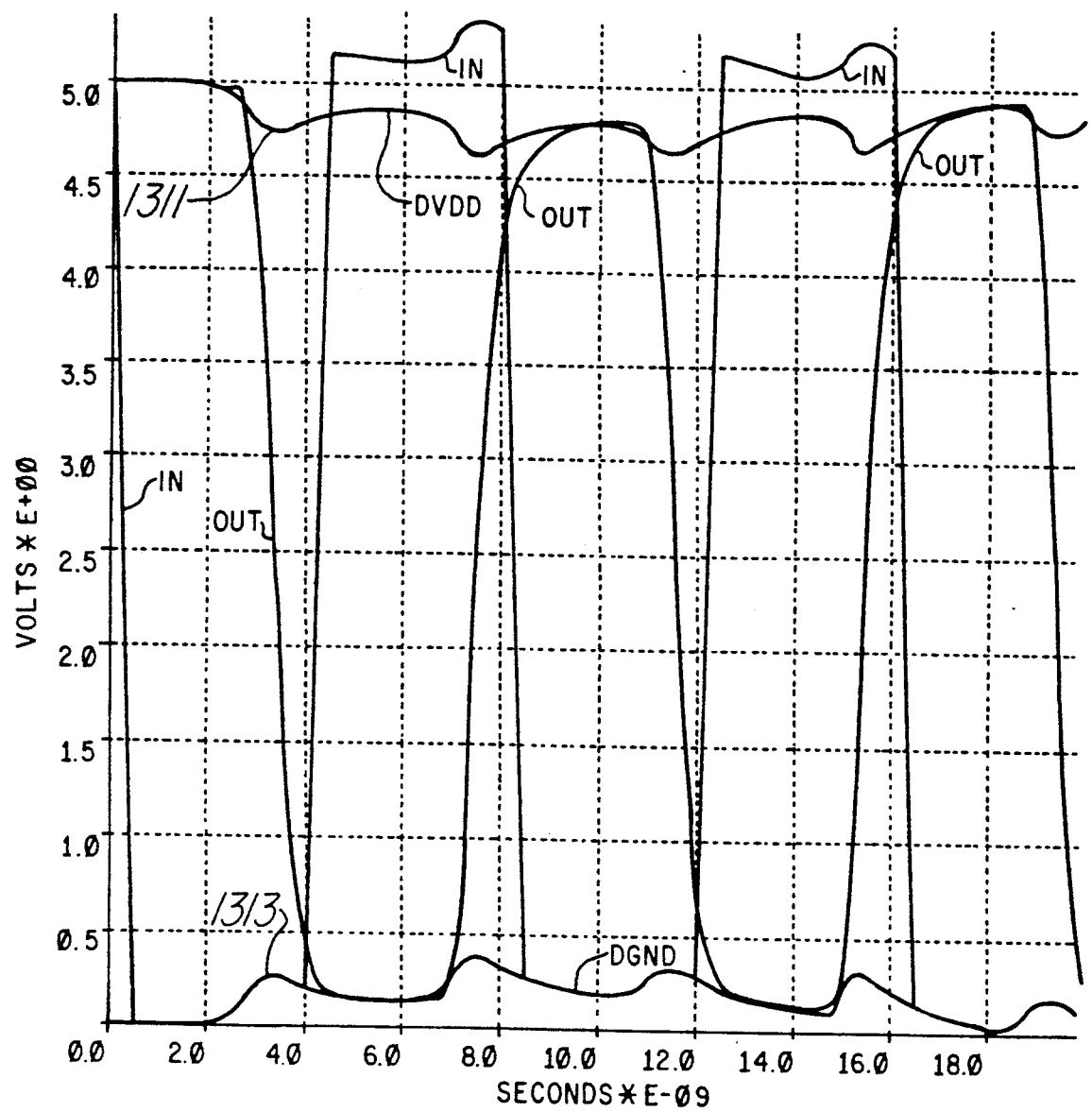
FIG. 10 is a waveform diagram of input, output, and supply rail voltages for the output circuit of the buffer circuit of FIG. 8.

FIG. 10 shows that when resistances R5-R9 are all 0.5 ohms, the power supply noise is significantly reduced to a fully acceptable level. Moreover, only a modest amount of ripple 1311 on DVDD and ripple 1313 on DGND remains. A clock input signal drives buffer 1211 on line IN and is effectively buffered to produce a dot clock voltage on line OUT in FIGS. 8 and 10.

Figure 11A:
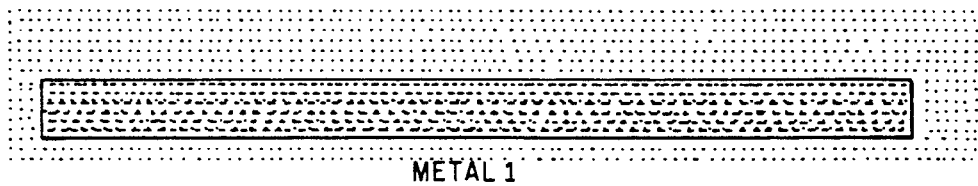
FIGS. 11A-C are microscopic plan views of layers for a strip of parallel FETs connected for increased capacitance and reduced resistance for power supply filtering.
Figure 11B:
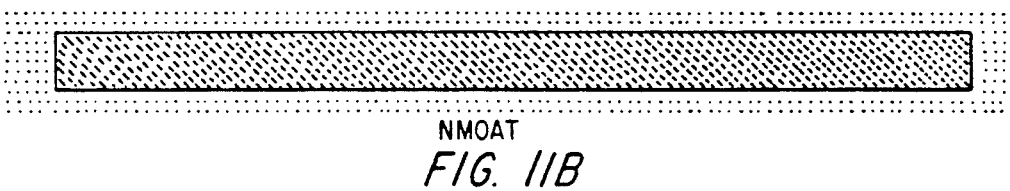
Figure 11C:
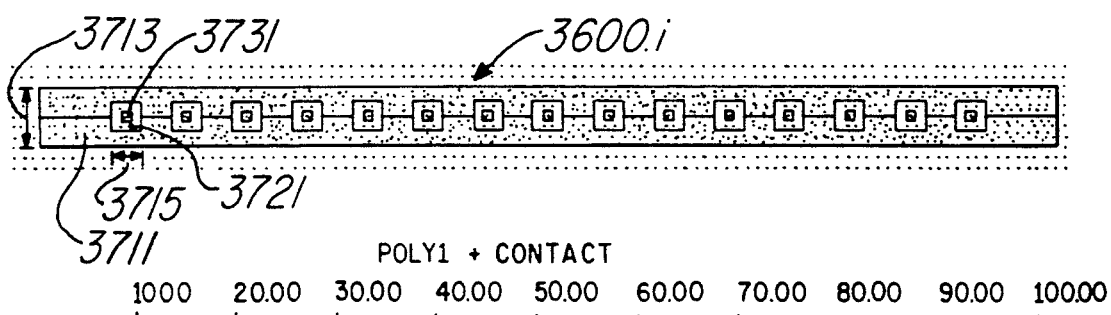

FIGS. 11A-C show how such a low resistance and high capacitance can be accomplished.

To implement a low-resistance capacitor with a digital-circuit type of wafer fabrication process, a gate capacitor is herein considered. However, a gate capacitor, that is a capacitor fabricated in the manner of the gate of a field effect transistor, tends to have a high resistance when the gate is simply made very long to provide a high capacitance.

Instead, FIGS. 11A-C and 12-14 show fabrication of many small gate capacitors in a special parallel configuration and structure. Since parallel capacitances add in value, the effective capacitance presented to the supply rails DVDD and DGND is much greater than the capacitance of any one gate capacitor in the network. Moreover, what might otherwise disadvantageously be a network with substantially large resistances is broken up into small low-resistance pieces which are connected in parallel. The result is a significant reduction in resistance because equal resistance elements in parallel provide a reduced resistance equal to the resistance of any one element divided by the number of elements in parallel.

Figure 14:
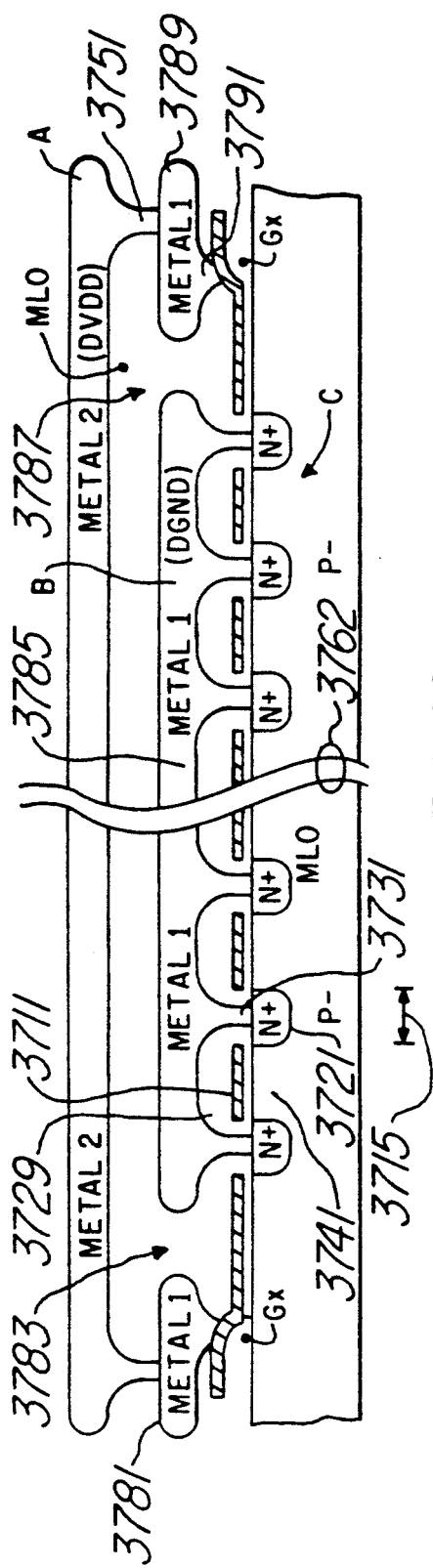
FIG. 14 is a microscopic cross-section of the capacitor structure of FIG. 12.

It is desirable that the integrated circuit capacitor provide a low impedance at high frequencies in excess of 100 MHz for instance. Low impedance is conferred by a combination of low resistance and high capacitance. In a preferred embodiment the gate and the moat of FIG. 14 are silicided to form a cladding that reduces resistance and adds further parallel capacitance to metal layers of deposited metalization designated metal1 and metal2 which are deposited above the gate capacitors to increase the overall capacitance. A capacitance CB between the polysilicon gate and metal1 also reduces impedance. Moreover, a capacitance CC exists between the low-resistance metal layers metal1 and metal2 that even further reduces impedance. The result is a four-layer sandwiched capacitor that has advantageously low resistance and AC impedance.

Advantageously, the structure of FIGS. 11A-C and 12-14 provides a bypass capacitor represented by a network RC of FIG. 9 that has a much lower distributed resistance and capacitive reactance than the impedance of the leads of the chip so that the power supply noise is effectively filtered.

Figure 12:
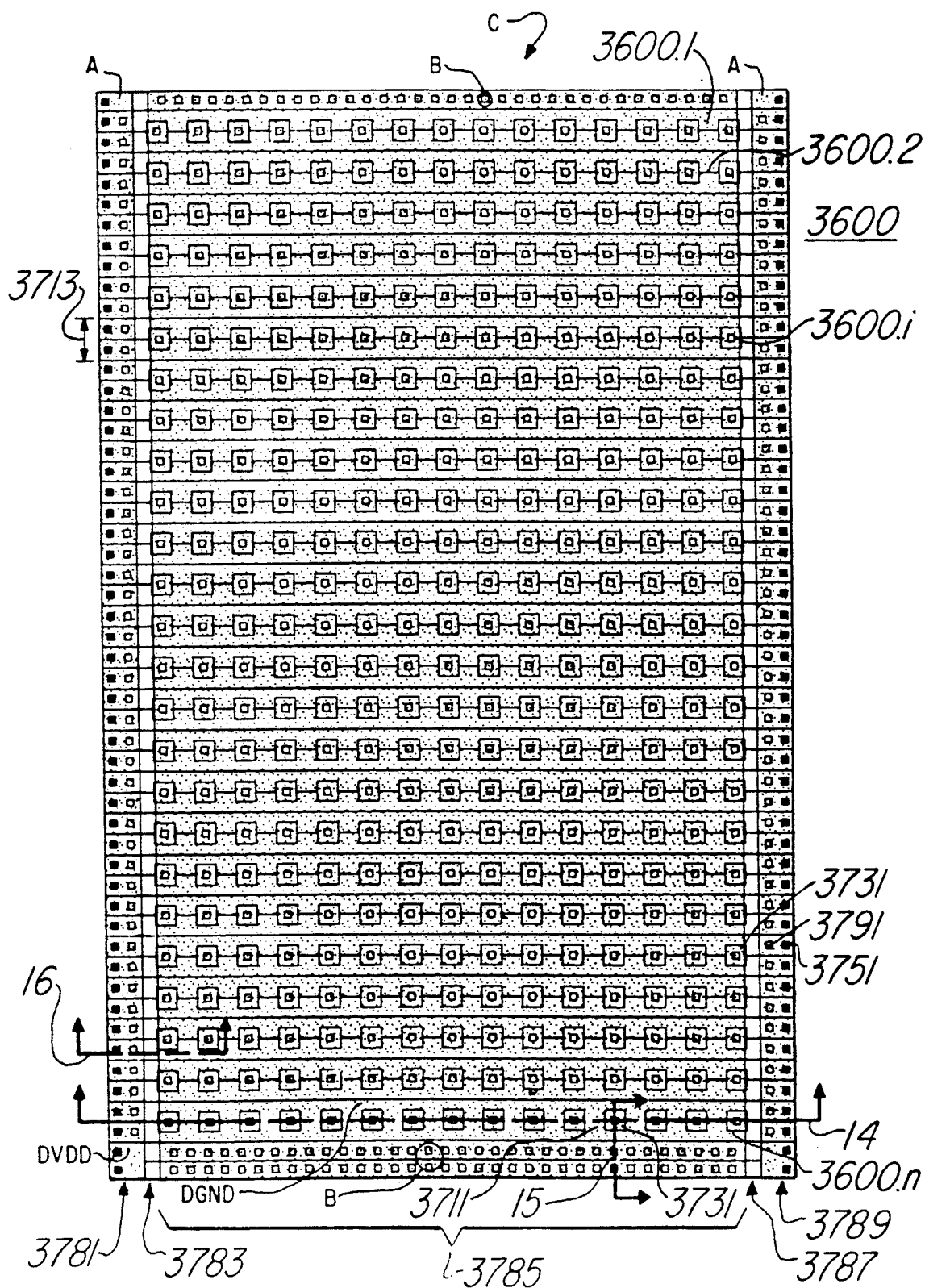
FIG. 12 is a microscopic plan view of a capacitor structure having many strips of FIGS. 11A-C united together.

In FIG. 12 a substantial capacitance of 1-10 nanofarads (1000-10000 picofarads), which is very useful for power supply noise reduction, is obtained in an area about 250 mils by 20 mils. This area in a preferred embodiment is used not only for the capacitor C but also for overlying interconnect in metal2 such as busses and power supply lines. In this way the area does double duty and is fully utilized without waste of die real estate.

Figure 13:
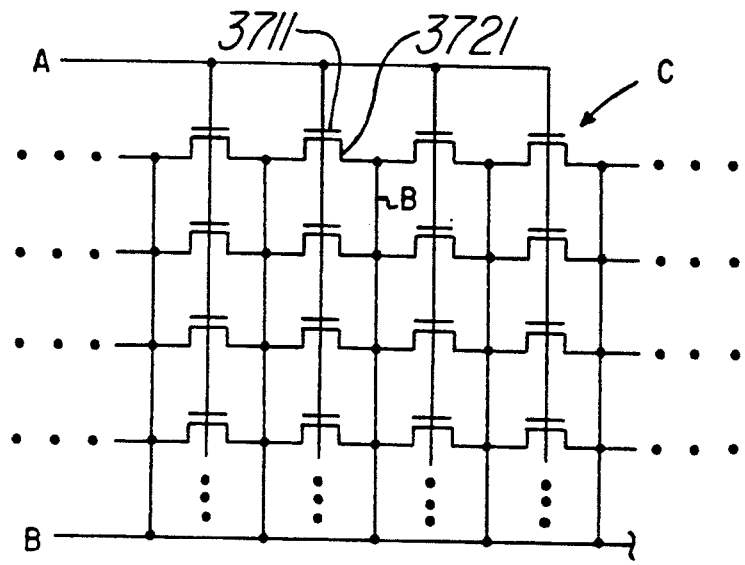
FIG. 13 is a schematic diagram of the capacitor structure of FIG. 12.
Figure 13A:
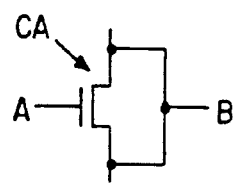
FIG. 13A is a simplified schematic diagram of the capacitor structure of FIG. 12.
Figure 13B:
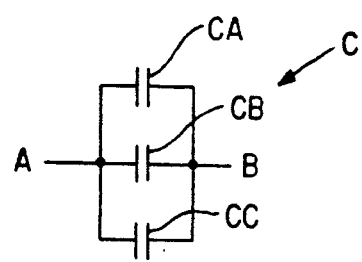
FIG. 13B is a still further simplified schematic diagram with labels for the capacitor structure of FIG. 12.

FIG. 13 is an electrical schematic diagram of capacitor C of FIG. 8 corresponding to the structure of FIG. 12. In FIG. 13 numerous FETs have their gates connected in parallel and connected to a conductor A. The sources and drains of all of the FETs are connected together and to a conductor B to form a capacitance CA as illustrated in simplified FIG. 13A. In FIG. 13B and FIG. 8 this capacitance is shown conceptually as a capacitor C (which is modeled by network RC in FIG. 9). Capacitor C has three capacitances CA, CB and CC which add to and augment one another. CA is the gate capacitance of the transistors taken together as in FIG. 13A. CB is the capacitance between the gates and metal1 above them. CC is the capacitance between metal1 layer and the overlying layer metal2. Conductors A and B are the two terminals of the capacitor C. Conductor designations A and B are correspondingly provided in FIGS. 8, 9, 12, 13, 13A, 13B, 14, 15, and 16 to clarify the physical and electrical relationships of the various figures. The capacitor C in FIG. 12 can be thought of conceptually as hundreds of rows of strips or segments 3600.1, .2 ... n, each strip being of the type of 3600.i of FIG. 11C. In this way a whole region of polysilicon of any rectangular or other shape has apertures with width 3715 provided with numerous contacts 3731 of FIGS. 11C and 14 from metal1 to n-moat. The region of FIG. 12 is shown with horizontal lines to relate to FIG. 11C and not because the horizontal lines necessarily represent structural boundaries.

Figure 16:
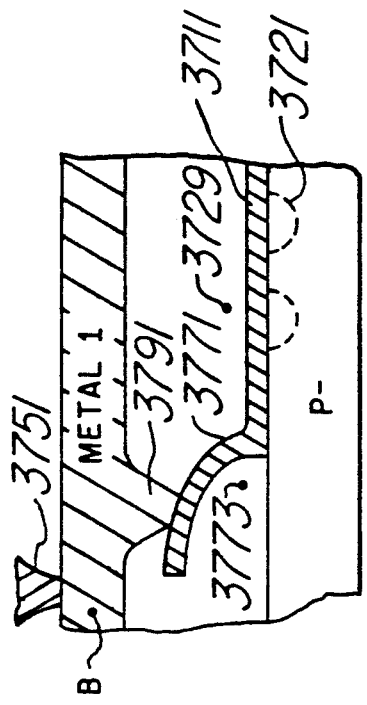
FIG. 16 is a microscopic cross-section of an end section of the capacitor structure of FIG. 12.

In FIG. 16 a peripheral contact region 3771 of polysilicon provides a low resistance connection to the sources/drains 3721. A dimension 3713 is marked on FIGS. 11C and 12 to further clarify corresponding parts. Thus, in FIGS. 11C and 12 the dimension 3713 encompasses one drain 3721 and two halves of polysilicon gates such as 3741.

Thus FIG. 12 shows an integrated circuit capacitor 3600 having a semiconductor die, a plurality of field effect transistors fabricated on the die and having gates, sources and drains. The gates are connected to each other as one side of the capacitor and the sources and drains are connected together as another side of the capacitor. The field effect transistors are connected in a rectangular array wherein the gates extend beyond each transistor to join with material of the gates of the other transistors. The source of one of the transistors and the drain of an adjacent one of the transistors merge in a same diffusion, and a metal layer contacts both the source and the drain of each of the transistors.

Figure 15:
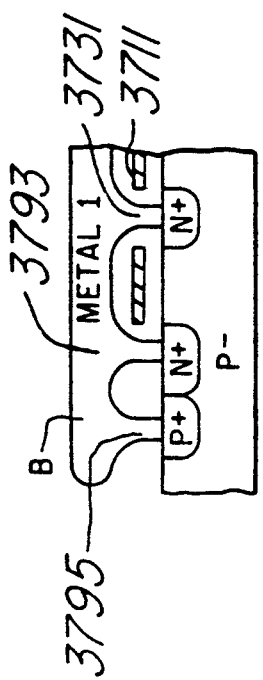
FIG. 15 is a microscopic cross-section transverse to that of FIG. 14.

In FIGS. 14 and 15 a stripe of polysilicon 3711 has cutouts or apertures of width 3715. The cutouts provide a means of intermediate contact to moat 3721 which is a region of n+ diffusion. A void formed by etch of oxide 3729 provides a contact region 3731 which is filled with metallization metal1. The actual capacitance is the gate oxide capacitance of the gate oxide Gx beneath the polysilicon 3711 and the n-channel enhanced in the p— substrate 3741. Comparing FIGS. 11A-C with FIGS. 12 and 14, it is noted that the polysilicon 3711.1, .2. .n joins together outside the area sectioned in FIG. 14. Break lines 3762 omit repetitious illustration in FIG. 14.

The capacitor C is connected externally by metal2 that provides a very low impedance connection A to the top rail DVDD.

Metal1 parallel-connects all the moat regions as shown in FIGS. 14 and 15. This lowers the impedance associated with the drain areas. Contacts 3793 and 3795 connect respective n+ and p+ moats to metal 1.

MLO (multilevel oxide) is deposited on metal1 to provide planarization, thus to provide a smooth surface for further deposition. Then metal2 is deposited on the MLO and into vias 3751 to provide contact between the two levels of metal.

A contact to the polysilicon 3711 is made exteriorly in FIGS. 14 and 16 and has polysilicon region 3771 over thick field oxide 3773 with a contact 3791 by metal1.

In FIG. 16 a cross-section of the peripheral contact region 3771 shows metal1 making electrical contact 3791 with the region 3771 which extends to polysilicon 3711 of FIG. 14. A peripheral region 3773 of thick oxide is also illustrated.

Some versions of the capacitor structure are as follows. In a first alternative, n-channel FETs are fabricated as n+ sources and drains on a type p— substrate. In a second alternative, p-channel FETs are fabricated as p+ sources and drains on a type n+ substrate. In a third alternative, a p-type substrate has an n-type well. In the n-type well are deposited n+ sources and drains.

Thus the FETs in various alternatives can be n-channel or p-channel enhancement or depletion FETs. Some embodiments omit the use of metal2. Also integrated circuit capacitors of other embodiments can be made in nonsilicided processes.

It is emphasized that the capacitor structure disclosed is advantageously provided in combination with any buffer or other integrated circuit to which its advantages commend it, in various embodiments. Still another embodiment is a standalone chip article of manufacture wherein the capacitor C is the only circuit on the chip.

Figure 17:
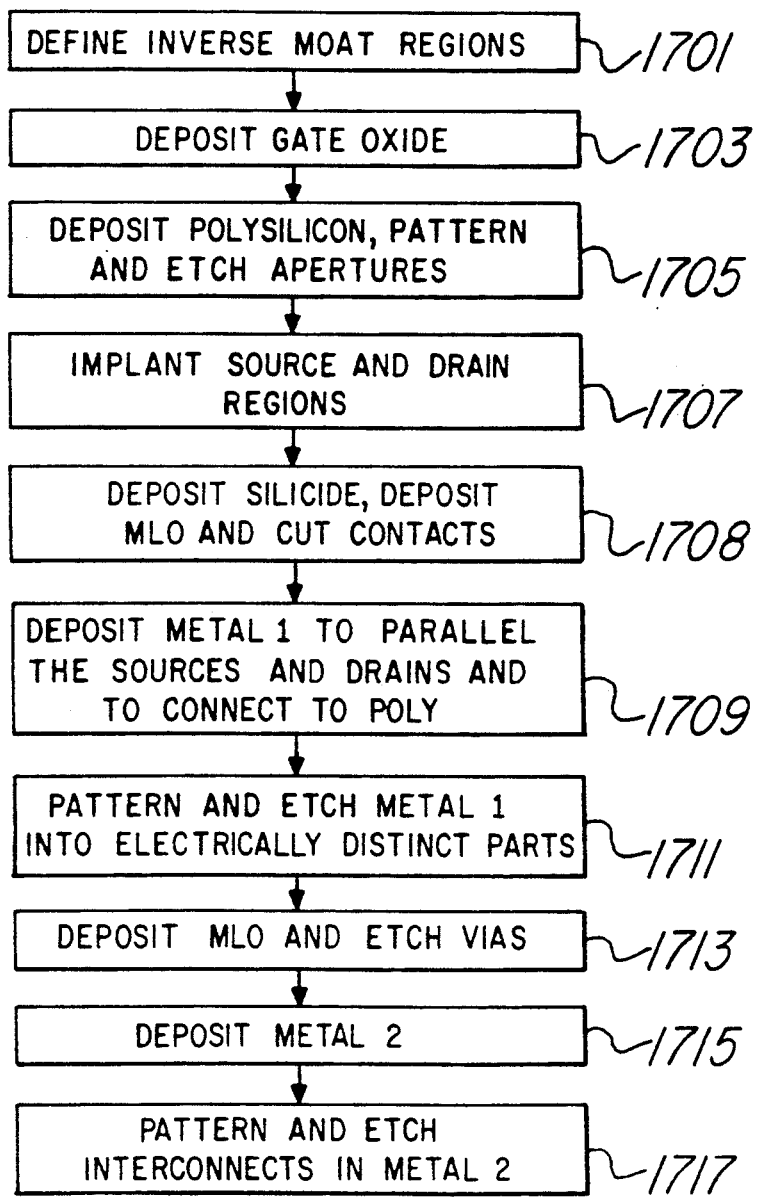
FIG. 17 is a flow diagram of a process of making the capacitor structure of FIG. 12.

In FIG. 17, a method of making the integrated circuit capacitor begins with a step 1701 to define inverse moat regions on a blank wafer including inverse moat of thick oxide 3773 defining the boundary of capacitor C. Then a step 1703 deposits gate oxide Gx of FIG. 14. Next a step 1705 deposits the polysilicon gate material, thus forming one side of the capacitor C. Patterning of apertures in a region of the gate material for the sources and drains of the FETS which will be paralleled to form the integrated circuit capacitor now occurs. Step 1707 implants the source and drain regions such as 3721 of FIG. 14. This is accomplished by introducing a diffusion into the substrate through the apertures 3715 in the polysilicon gate 3711 material, which self-aligns the sources and drains with the gate material. Then in step 1708, titanium disilicide (silicide for short) is deposited, and multilevel oxide (MLO) 3729 is deposited and etched to cut contacts.

In a further step 1709, a conductive layer of metal1 is deposited. This deposit establishes the contacts and connects the sources and drains in parallel and also connects to the polysilicon gate region exteriorly in FIGS. 14 and 16. In this way the gate material is also connected with the layer of conductive material of metal1. Then a step 1711 patterns or etches the layer metal1 of conductive material into electrically distinct first and second parts so that the first part 3781, 3789 of the layer is connected to the gate material and the second part 3785 of the layer is connected to the diffusion through the apertures, thereby forming terminals A and B of the integrated circuit capacitor C. Insulating regions of separation 3783 and 3787 divide the first and second parts of metal1 in FIGS. 12 and 14. Next, a step 1713 deposits more MLO and vias are etched. A second layer of conductive material metal2 is deposited in step 1715. Then a step 1717 patterns and etches interconnects, such as busses and power leads, in the layer metal2.

In FIG. 18 circuitry connected to the circuit of FIG. 7 tightly controls the delay between dot clock and each of VCLK and SCLK. For example, D flip-flops X5 and X6 have data inputs fed by lines VMUX0 and SMUX0 respectively and are clocked from dot clock for resynchronization. The TRI_BUFF circuits X7-X10 are two pairs of tristate buffers. Each pair operates as a selector under the control of VEQD or SEQD. If VEQD is active, then buffer X10 is enabled to drive the input of VCLK buffer 4341 with dot clock. If VEQD is inactive, inverter X14 activates buffer X8 to pass resynchronized frequency divided pulses VMUX0S to buffer 4341 instead.

Analogous selection of dot clock or resynchronized signal SMUX0S depending on signal SEQD is implemented by tristate buffers X7 and X9 and inverter X13. The selected clock signal is fed to a circuit X33 which provides the load signal LD for input latch 4011 of FIG. 3. The same selected clock signal is fed to a control circuit X15 which inserts a split shift register transfer pulse SSRT during blanking. Circuit X15 supplies a shift clock buffer circuit 4343 which in the present embodiment is identical with circuit 4341. Buffer 4343 is suitable for providing shift clock input to banks of VRAM (video RAM) which in turn provide pixel data from the VRAM to the input latch 4011 of FIG. 3.

In FIG. 18 buffering is provided by buffers such as 4341 and 4343 to drive several inputs externally of the chip 4000 as necessary and to increase the current capability of the chip 4000 for external drive over what is needed for internal circuits to drive each other on-chip.

Clock output buffer 3501 of FIG. 19 is advantageously used to implement the buffer blocks such as VCLK_BUFFER 4341 and SCLK-BUFFER 4343 of FIGS. 3 and 18. The buffer circuit 3501 is also useful for other drivers and buffers in all other applications to which its advantages commend it.

The buffer 3501 drives high capacitive loads at very high frequencies. Buffer 3501 minimizes power supply current spikes associated with driving the inductance and resistance of supply wires and bond wires into an external load.

Graphics systems use differing amounts of VRAM which present different amounts of capacitance depending on how many VRAMs are used. The buffer 3501 is capable of driving high capacitance loads to accommodate a highest capacitance, or worst-case, VRAM configuration. The demands on the buffer are accommodated at even high frequencies in which the maximum capacitance is driven at a shift clock frequency equal to the dot clock rate in some modes of a palette.

One example of a graphics system running at 1024×768×8 (1024 pixels per line, 768 lines, and 8 bits per pixel) has 8 VRAMS that present a load of approximately 75 picofarads. If the display system is operated in a 4:1 mode, for instance, the shift clock frequency is one-fourth of the dot clock frequency, or about 35 MHz.

An output stage 3511 of circuit 3501 has an n-channel source follower. Advantageously, the n-channel device provides enhanced drive capability for source and sink current capability in a reasonable amount of silicon area. Moreover, the source follower itself limits the output voltage swing thereby reducing positive power supply glitches that might otherwise occur due to switching overshoot. Series resistance R9 is added between supply rail VDD and each of the output device drivers in respective buffers 4341 and 4343 to further minimize switching current spikes.

Without series resistance R9, the source follower transistor 3511 exhibits minimal Miller Effect capacitance. Miller Effect capacitance is a multiplication of inherent capacitance in transistor 3511 due to voltage amplification by the transistor circuit. Since the voltage amplification of a source follower is unity, the Miller Effect is minimal. However, in the embodiment of FIG. 19, it is recognized that a pure source follower configuration makes it harder to control output slew time. Accordingly, series resistance R9 is deliberately introduced to also cause a controlled introduction of the Miller Effect in an amount small enough to retain high speed operation advantages and an amount great enough to establish a controlled slew time. Resistance R9 is but one example of a voltage dropping circuit that can be connected between the source follower and the supply rail. Another example of a voltage dropping circuit is a p-n diode connected for conduction. Still another example is a diode-connected field effect transistor having its gate connected to its drain and having the source and drain connected between the source follower and the supply rail VDD. Yet another example is a bipolar junction transistor (BJT) connected between the source follower and the supply rail. Still other more elaborate voltage dropping circuits of passive or active type and even having input lines for selectable characteristics responsive to one or more control signals are also contemplated.

Negative rail spikes are addressed by n-channel output driver 3521. Driver 3521 has a large 1500/1 n-channel device M4 plus several smaller n-channel devices M12, M11, M10 and M1 (100/1) connected in parallel. Four n-channel devices M5-M8 have gates connected together to buffered input IN. The drains of devices M5-M8 respectively drive the gates of the devices M12, M11, M10 and M1. FETs M8 and M9 form a CMOS inverter. FET M9 charges an RC network of resistors R1-R3 and gate capacitances from rail VDD. The device M4 has its gate connected to the gate of M1 for concurrent drive therewith. The devices M1, M4, M10, M11, M12 are all turned off quickly by the use of the four separate n-channel devices M5-M8. Advantageously, on turn-on, not all of the devices M5-M8 are switched on instantly due to the resistances R1, R2, R3. Compare with coassigned incorporated U.S. Pat. No. 4,771,195 "Integrated Circuit to Reduce Switching Noise". The circuit 3501 thus avoids a significant negative going voltage spike at the output OUT which could cause an unwanted current spike in the ground power supply line 3531.

Also, the n-channel transistor M3 acts as a diode that prevents negative overshoot, or OUT output voltage below ground reference. This is because the gate of M3 would turn M3 off if the voltage at OUT were to begin to go negative. Various unidirectional conduction circuits are alternatively fabricated in various embodiments in substitution for the FET M3 to accomplish this result also.

Although negative overshoot is undesirable in this embodiment, it is preferable that output line OUT be able to be pulled all the way to zero volts, or ground, when the output signal is to be low. The presence of a diode drop in M3 without more would prevent output line OUT from being pulled all the way to ground. The parallel transistors MI, M10, M11 and M12 pull the output all the way to ground at an advantageously controlled rate.

This delay characteristic is achieved by series resistors R1-R3 between the gates of devices M12, M11, M10, M1 and the p-channel M9. Transistor M9, when on, pulls the gates of M1, M4 to the positive supply VDD. The resistors R1, R2 and R3 in series with the gate capacitance of each device form an RC delay line that delays and controls the turn-on slightly such that the output waveform pull down characteristic is more gradual.

Advantageously, the circuit of FIG. 19 provides a fast turn-off control by means of n-channel transistors M5, M6, M7 and M8. When their gates go high, the drains correspondingly go low at the gates of M12, M11, M10 and M1 and M4 turning them off quickly. The high from inverter X4 is provided via inverters to the gate of n-channel transistor 3511, which turns transistor 3511 on. This pulls output OUT toward the positive rail VDD but not completely thereto because of an on-voltage drop Vt of transistor 3511 of about 0.7-1.0 volt. Also, resistor R9 has a voltage drop. Advantageously, power is reduced in this way because it is unnecessary to drive TTL (which calls for 0.8-2.0 volt swing) with the full voltage 5.0 volts nominal anyway. Also, power supply switching noise is substantially reduced.

Buffer 3501 does not pull all the way to the positive rail and has slightly delayed or lengthened rise and fall times. However, these considerations are inconsequential in view of TTL input to VRAMs (see SCLK in FIG. 1), substantial reduction of spikes and the ability to drive a 75 pf load at high frequencies.

In FIG. 19A a method of making and operating a buffer circuit includes a step 1901 of introducing a controlled amount of Miller effect capacitance in a source follower output transistor of the buffer. Then a step 1903 couples a second output transistor with a unidirectional conducting circuit so that the output transistor is in push-pull with the source follower. A next step 1905 controls turn-on of the second output transistor with delay-coupled transistors connected to the second output transistor. A further step 1907 bypasses the delay-coupling of the delay-coupled transistors when turning off the second output transistor.

A few preferred embodiments have been described in detail hereinabove. It is to be understood that the scope of the invention comprehends embodiments superficially different from those described yet within the inventive scope. For a few examples, color display devices utilized in combination can be raster-scanned cathode ray tube monitors, other raster-scanned devices, devices that are not raster-scanned and devices that have parallelized line or frame drives, color printers, film formatters, and other hard copy displays, liquid crystal, plasma, holographic, deformable micromirror, and other displays of non-CRT technology, and three-dimensional and other nonplanar image formation technologies.

Microprocessor and microcomputer in some contexts are used to mean that microcomputer requires a memory; the usage herein is that these terms can also be synonymous and refer to equivalent things. The phrase processing circuitry comprehends ASIC circuits, PALs, PLAs, decoders, memories, non-software based processors, or other circuitry, or digital computers including microprocessors and microcomputers of any architecture, or combinations hereof. Palette in some contexts refers to a specific look-up table device and in the present work it also comprehends alternative color data word generation combined with one or more associated circuits such as digital to analog converter, selectors, timing controls, and functional and testability circuits and interfaces. Internal and external connections can be ohmic, capacitive, direct or indirect via intervening circuits or otherwise as desirable. Implementation is contemplated in discrete components or fully integrated circuits in silicon, gallium arsenide, and other electronic materials families as well as in optical-based or other technology-based forms and embodiments. Transistors of opposite n and p conductivity types (or NPN and PNP) can be substituted for each other and polarities of supply rails reversed accordingly. It should be understood that various embodiments of the invention can employ hardware, software or microcoded firmware. Process diagrams herein are also representative of flow diagrams for microcoded and software based embodiments. Processes calling for deposition of layers of conductive or insulative type can be alternatively implemented by depositing a layer of the opposite type and radiatively or otherwise physically altering the conductive or insulating nature of the layer. This can eliminate vias, for instance. See for example, near-UV or soft X-ray irradiation of polyimide as described in coassigned U.S. patent application Ser. No. 590,259 which is hereby incorporated herein by reference. The range of embodiments and scope of the invention contemplates such process embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to this description. It is therefore contemplated that the appended claims cover any such modifications or embodiments as fall within the true scope of the invention.

What is claimed is:

1. An integrated circuit buffer having first and second supply rails and comprising:
    a source follower output field effect transistor having a source coupled to an output line and further having a drain;
    a voltage dropping circuit connected between the drain of the source follower output field effect transistor and the first supply rail, said voltage dropping circuit for introducing a controlled amount of Miller effect capacitance in the source follower output field effect transistor;
    a common source output transistor connected to the second supply rail; and
    a diode coupled between the common source output transistor and the source of said source follower output field effect transistor.

2. The buffer of claim 1 further comprising a plurality of first transistors connected between the output and the second supply rail and having a delay element coupled between gates of each of said first transistors.

3. The buffer of claim 2 further comprising additional transistors coupled between gates of the first transistors and the second supply rail and connected to selectively bypass the delay element between the first transistors.

4. The buffer of claim 1 wherein said voltage dropping circuit comprises a resistor.

5. The buffer of claim 1 wherein said voltage dropping circuit comprises a p-n diode connected for conduction.

6. The buffer of claim 1 wherein said voltage dropping circuit comprises a diode connected field effect transistor having a gate connected to a drain and having a source connected to the drain of said source follower and said drain connected to said first supply rail.

7. The buffer of claim 1 wherein said voltage dropping circuit comprises a bipolar junction transistor.

8. The buffer of claim 1 wherein said diode comprises an n-channel transistor coupled to perform as a diode.

9. An integrated circuit buffer comprising:
    a source follower output field effect transistor having an output and also resistively connected to a supply rail thereby introducing a controlled amount of Miller effect capacitance in the source follower output transistor;
    a common source output field effect transistor and a diode-connected field effect transistor connected between the common source output transistor and the source follower output transistor;

a plurality of first field effect transistors connected in parallel between the output and a ground rail, each said first field effect transistors having a gate wherein a resistive delay is coupled between the gates of adjacent ones of said first field effect transistors; and additional transistors connected between the gates of the first field effect transistors and a second supply rail to selectively bypass the delay coupling between the first transistors, the additional transistors having gates connected together to an input of the buffer; and a drive circuit having an input connected to the input of the buffer and having an output connected to a gate of the source follower field effect transistor.

10. A method of operating a buffer comprising:

introducing a controlled amount of Miller effect capacitance in a source follower output transistor of the buffer;

coupling a second output transistor with a unidirectional conducting circuit so that the output transistor is in push-pull with the source follower;

controlling turn-on of the second output transistor with at least first and second transistors connected to the second output transistor wherein an input signal to the second transistor is delayed relative to an input signal to the first transistor; and selectively bypassing the delay between the first and second transistors when turning off the second output transistor.

11. A circuit comprising:

ten transistors each having a source, a drain and a gate;

four inverters each having an input and an output; and four resistors each having first and second terminals; said circuit coupled as follows:

the output of said first inverter coupled to the inputs of said second and fourth inverters and also to the gates of said first, second and third transistors;

the output of said second inverter coupled to the input of said third inverter;

the output of said third inverter coupled to the gate of said tenth transistor;

the drains of said first, second, third, fourth, fifth, sixth, eighth and ninth transistors coupled to a reference voltage node;

the source of said first transistor coupled to the gate of said ninth transistor and to the first terminal of said first resistor;

the source of said second transistor coupled to the gate of said eighth transistor and to the first terminal of said second resistor and to the second terminal of said first resistor;

the source of said third transistor coupled to the gate of said sixth transistor and to the second terminal of said second resistor and to the first terminal of said third resistor;

the output of said fourth inverter coupled to the second terminal of the third resistor and to the gates of the fourth and fifth transistors;

the source of the fifth transistor coupled to the drain of the seventh transistor;

the source of the seventh transistor coupled to the gate of the seventh transistor and to the drain of the tenth transistor and to the sources of the fourth, sixth, eighth and ninth transistors;

the source of the tenth transistor coupled to the first terminal of the fourth resistor; and the second terminal of the fourth resistor coupled to a supply voltage node.

12. The circuit of claim 11 wherein said fourth inverter comprises an NMOS transistor and a PMOS transistor.

* * * * *